United States Patent
Kameyama et al.

(10) Patent No.: US 7,566,588 B2
(45) Date of Patent: Jul. 28, 2009

(54) SEMICONDUCTOR DEVICE WITH A RESIN-SEALED OPTICAL SEMICONDUCTOR ELEMENT

(75) Inventors: Koujiro Kameyama, Gunma (JP); Kiyoshi Mita, Gunma (JP)

(73) Assignees: Sanyo Electric Co., Ltd., Osaka (JP); Kanto Sanyo Semiconductors Co., Ltd., Gunma (JP)

( * ) Notice: Subject to any disclaimer, the term of this patent is extended or adjusted under 35 U.S.C. 154(b) by 106 days.

(21) Appl. No.: 11/549,528

(22) Filed: Oct. 13, 2006

(65) Prior Publication Data

US 2007/0069232 A1    Mar. 29, 2007

Related U.S. Application Data

(62) Division of application No. 10/787,614, filed on Feb. 26, 2004, now Pat. No. 7,183,589.

(30) Foreign Application Priority Data

Feb. 28, 2003  (JP)  ............................. 2003-052319
Mar. 26, 2003  (JP)  ............................. 2003-086383

(51) Int. Cl.
*H01L 33/00* (2006.01)
*H01L 31/0203* (2006.01)

(52) U.S. Cl. ........................... 438/116; 438/25; 438/64; 257/E33.056; 257/E31.117

(58) Field of Classification Search ................ 264/134, 264/135, 272.17; 438/25–27, 64–68, 106–127; 257/E23.061, E23.116, E25.013, E31.117, 257/E31.118, E33.056–E33.059
See application file for complete search history.

(56) References Cited

U.S. PATENT DOCUMENTS

| 5,122,861 | A | 6/1992 | Tamura et al. |
| 5,264,393 | A | 11/1993 | Tamura et al. ............... 438/209 |
| 5,484,647 | A | 1/1996 | Nakatani et al. |
| 5,846,477 | A * | 12/1998 | Hotta et al. .................. 264/511 |
| 5,862,248 | A * | 1/1999 | Salatino et al. .............. 382/124 |
| 5,888,627 | A | 3/1999 | Nakatani |
| 5,952,714 | A | 9/1999 | Sano et al. |
| 6,300,686 | B1 | 10/2001 | Hirano et al. |
| 6,503,780 | B1 | 1/2003 | Glenn et al. |
| 6,900,531 | B2 | 5/2005 | Foong et al. |
| 2002/0163054 | A1 | 11/2002 | Suda |
| 2003/0034124 | A1 | 2/2003 | Sugaya et al. |
| 2003/0062518 | A1 | 4/2003 | Auch et al. |
| 2005/0230848 | A1 | 10/2005 | Nakatani et al. |

* cited by examiner

*Primary Examiner*—Marcos D. Pizarro
(74) *Attorney, Agent, or Firm*—Fish & Richardson P.C.

(57) ABSTRACT

To provide a semiconductor device 10, which is thin, compact, and excellent in mechanical strength and humidity resistance. Semiconductor device 10A has a configuration such that in semiconductor device 10A, wherein an optical semiconductor element 14, having a light receiving part or a light emitting part, is sealed in a sealing resin 13, a cover layer 12, covering the top surface of optical semiconductor element 14, is exposed from the top surface of sealing resin 13. Thus in comparison to a related-art example with which the entirety is sealed by a transparent resin, sealing resin 13 can be formed thinly and the thickness of the entire device can be made thin. Furthermore, semiconductor device 10 is arranged using a sealing resin having a filler mixed in. A semiconductor device that is excellent in mechanical strength and humidity resistance can thus be arranged.

14 Claims, 26 Drawing Sheets

SEMICONDUCTOR DEVICE WITH A RESIN-SEALED OPTICAL SEMICONDUCTOR ELEMENT

This application is a divisional of U.S. application Ser. No. 10/787,614, filed Feb. 26, 2004, now U.S. Pat. No. 7,183,589, which, in turn, claims the benefit of Japanese priority applications, serial no. 2003-052319, filed Feb. 28, 2003 and Ser. No. 2003-086383, filed Mar. 26, 2003.

BACKGROUND OF THE INVENTION

1. Field of the Art

This invention relates to a semiconductor device incorporating a light receiving element or a light-emitting element.

2. Description of the Related Art

The configuration of a conventional optical semiconductor device 100 shall now be described with reference to FIG. 29. FIG. 29A is a plan view of semiconductor device 100 and FIG. 29B is a sectional view of semiconductor device 100.

As shown in FIGS. 29A and 29B, an optical semiconductor element 103 is affixed onto a land 102, formed of copper or other conductive member. Here, a semiconductor element, having a light receiving element, such as a CCD (Charge Coupled Device) image sensor, etc., or a light emitting element, such as an LED (Light Emitting Diode), etc., formed on the top surface thereof, may be employed as optical semiconductor element 103. A plurality of leads 101 are disposed near land 102, and electrodes provided at peripheral parts of optical semiconductor element 103 and leads 101 are electrically connected via metal wires 104.

A transparent resin 105 seals optical semiconductor element 103, land 102, metal wires 104, and leads 101. Transparent resin 105 comprises an optically transparent thermosetting resin or thermoplastic resin. Optical semiconductor element 103 thus performs input and output of optical signals with the exterior via transparent resin 105, which covers its upper part.

However, in order to maintain its transparency, transparent resin 105, which is used in conventional optical semiconductor device 100, does not have a filler added. There is thus a problem in terms of the property of radiating the heat generated from optical semiconductor element 103, and cracks form in transparent resin 105 due to temperature changes under the condition so fuse. Transparent resin 105 furthermore has problems in terms of resistance to humidity, mechanical strength, and adhesion to the conductive member. These problems cause optical semiconductor device 100 to be low in reliability.

Also, in order to prevent excessive adhesion of transparent resin 105 to a mold die for performing resin sealing, additives, such as a mold release agent, are mixed in transparent resin 105. The transparency of transparent resin 105 is thus made inadequate due to such additives. Furthermore, since transparent resin 105 itself is a resin, it is poor in transparency in comparison to glass, etc. Thus in the case where optical semiconductor element 103 is a CCD, the performance of the CCD could not be exhibited adequately due to transparent resin 105 attenuating and reflecting the light entering from the exterior.

Also, transparent resin 105 is formed thickly so as to cover not only the top surface of optical semiconductor element 103 but also the peak parts of metal wires 104. The thickness of the entirety of optical semiconductor element 103 is thus increased and there is a limit to making the device compact and thin.

This invention has been made in view of the above problems, and a main object of this invention is to provide a thin optical semiconductor element that is excellent in humidity resistance and mechanical strength and a method of manufacture thereof.

SUMMARY OF THE INVENTION

The following preferred embodiments provide a semiconductor device, comprising an optical semiconductor element, having a light receiving part or a light emitting part being sealed in a sealing resin, wherein a cover layer, covering a top surface of the optical semiconductor element is exposed from a top surface of the sealing resin.

A semiconductor device described in the preferred embodiments comprises: an optical semiconductor element, having a light receiving part or a light emitting part; a cover layer, covering a top surface of the optical semiconductor element; a land, onto which the optical semiconductor element is affixed; leads, electrically connected via metal wires to the optical semiconductor element and forming external electrodes; and a sealing resin, sealing the optical semiconductor element, the metal wires, the land, and the leads; wherein the cover layer is exposed from the sealing resin.

A semiconductor device of the preferred embodiment further comprises: an optical semiconductor element, having a light receiving part or a light emitting part; a cover layer, covering the a surface of the optical semiconductor element; a mounting substrate, on the top surface of which conductive paths are formed and the optical semiconductor element is set; metal wires, electrically connecting the optical semiconductor element and the conductive paths; and a sealing resin, sealing the optical semiconductor element and the metal wires; wherein the cover layer is exposed from the sealing resin.

A semiconductor device as further described in the preferred embodiments comprises: an optical semiconductor element, having a light receiving part or a light emitting part; a cover layer, covering a top surface of the optical semiconductor element; conductive patterns; separated by separation grooves and on an upper part of which is affixed the optical semiconductor element; and a sealing resin, covering the optical semiconductor element and the conductive patterns and filled in the separation grooves while leaving the rear surfaces of the conductive patterns exposed; wherein the cover layer is exposed from the sealing resin.

A semiconductor device of the preferred embodiments comprises: an optical semiconductor element having a light receiving part or a light emitting part; external electrodes, disposed below the optical semiconductor element and connected to the optical semiconductor element via metal wires; a casing, having a cover layer, formed of a transparent material, disposed at an upper part and containing the optical semiconductor element and the metal wires in the interior thereof; and a transparent resin, filled in the gaps between the interior of the casing and the optical semiconductor element.

A semiconductor device manufacturing method of the preferred embodiments comprises the step of sealing an optical semiconductor element, having a light receiving part or a light emitting part, with a sealing resin; wherein the top surface of a cover layer, which covers the top surface of the optical semiconductor element, is protected with a sheet and the sealing with sealing resin is performed thereafter to make the cover layer be exposed from the sealing resin.

A semiconductor device manufacturing method of the preferred embodiments comprises: processing a substrate, comprising a conductive member, and providing lands and leads on the substrate; adhering the bottom surface of the substrate onto a first sheet; covering the top surfaces of optical semiconductor elements with cover layers; affixing the optical semiconductor elements onto the lands of the substrate; protecting the top surfaces of the cover layers with a second sheet; and sealing the lands, the leads, and the optical semiconductor elements on the substrate with a sealing resin.

A semiconductor device manufacturing method of the preferred embodiments further comprises: forming conductive patterns by forming separation grooves in regions of a conductive foil besides locations that are to become the conductive patterns; covering the top surfaces of optical semiconductor elements with cover layers; affixing the optical semiconductor elements onto the conductive patterns; protecting the top surfaces of the cover layers with a sheet; forming a sealing resin so as to cover the optical semiconductor elements and fill the separation grooves; and electrically separating each of the conductive patterns.

A further semiconductor device manufacturing method of the preferred embodiments comprises: preparing a casing, which has a cover layer, formed of a transparent material, provided on an upper part thereof; forming external electrodes on the rear surface of an optical semiconductor and electrically connecting the optical semiconductor element and the external electrodes with metal wires; sealing the optical semiconductor element and the metal wires with a transparent resin and thereby making the external shape of the transparent resin a shape that fits the interior of the casing; and fitting the transparent resin into the interior of the casing.

A semiconductor device of the preferred embodiments comprises: an optical semiconductor element, having a light receiving part or a light emitting part; a cover layer, covering the top surface of the optical semiconductor element; a semiconductor element, electrically connected to the optical semiconductor element; external electrodes, electrically connected to the semiconductor element for performing input and output of electrical signals with the exterior; and a sealing resin, sealing the optical semiconductor element and the semiconductor element; wherein the cover layer is exposed from the sealing resin.

A further semiconductor device of the preferred embodiments comprising: a semiconductor element; a sealing member, sealing the semiconductor element; and conductive members, forming external electrodes that are electrically connected to the semiconductor element and exposed from the sealing member; wherein the semiconductor element in turn comprises: a semiconductor substrate; circuit parts, provided on the top surface of the semiconductor substrate; indented parts, provided at peripheral parts of the semiconductor substrate; and metal wirings, connected to the circuit parts and forming electrodes at the indented parts.

A semiconductor device manufacturing method of the preferred embodiments comprises: forming a plurality of circuit parts on the top surface of a wafer; forming indented parts by partially cutting peripheral parts of each of the circuit parts; forming metal wirings so as to arrange electrodes, which are electrically connected to the circuit parts, at the indented parts; dividing the wafer at locations of the indented parts and thereby dividing the wafer into respective semiconductor elements; electrically connecting the electrodes with other conductive members; and sealing the semiconductor elements.

The embodiments of this invention provide the following effects.

In these embodiments, cover layer 12, covering the upper surface of optical semiconductor element 14, can be exposed from sealing resin 13. Thus in comparison to the prior art example wherein the entirety is sealed by a transparent resin, sealing resin 13 can be formed thinly and the thickness of the entire device can be made thin. Furthermore, since optical semiconductor element 14 is exposed to the exterior via cover layer 12, in a case where optical semiconductor element 14 is a light receiving element, optical signals that are input from the exterior can be received with the attenuation thereof being restrained. Also, in a case where optical semiconductor element 14 is a light receiving element, the attenuation of the emitted optical signals can be restrained.

Furthermore, semiconductor device 10 is configured using a light blocking sealing resin having a filler mixed therein. A semiconductor device that is excellent in mechanical strength and humidity resistance can thus be obtained.

In semiconductor device manufacturing method described in the preferred embodiments of this invention, the upper part of cover layer 12 is covered with sheet 51 and sealing by sealing resin 13 is performed thereafter. Also, sheet 51 is adhered onto cover layer 12 by means of an adhesive agent. The attachment of sealing resin 13 to the top surface of cover layer 12 in the mold sealing step can thus be prevented.

DESCRIPTION OF THE PREFERRED EMBODIMENTS

First Embodiment

Figure 1A:
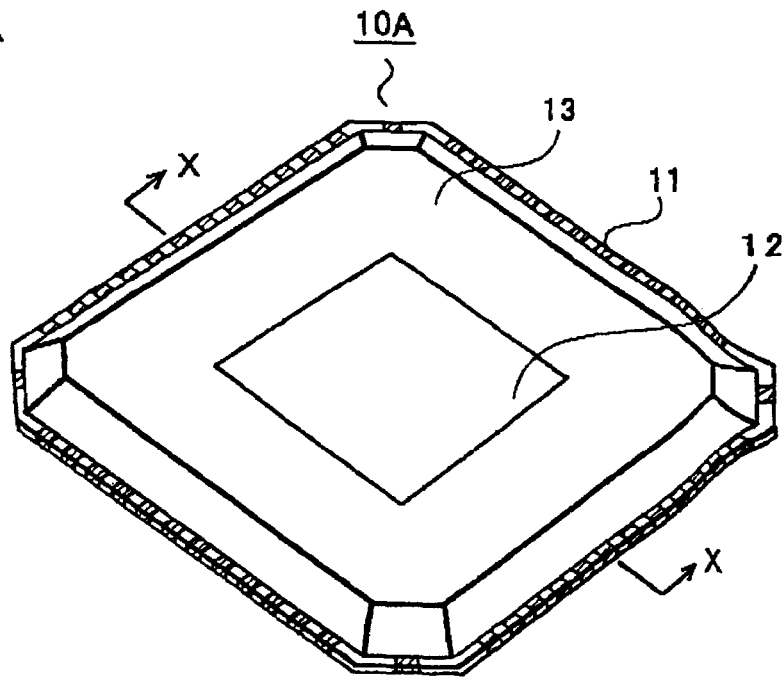
FIG. 1 is a perspective view (A) and a rearview (B) showing a semiconductor device of a preferred embodiment.
Figure 1B:
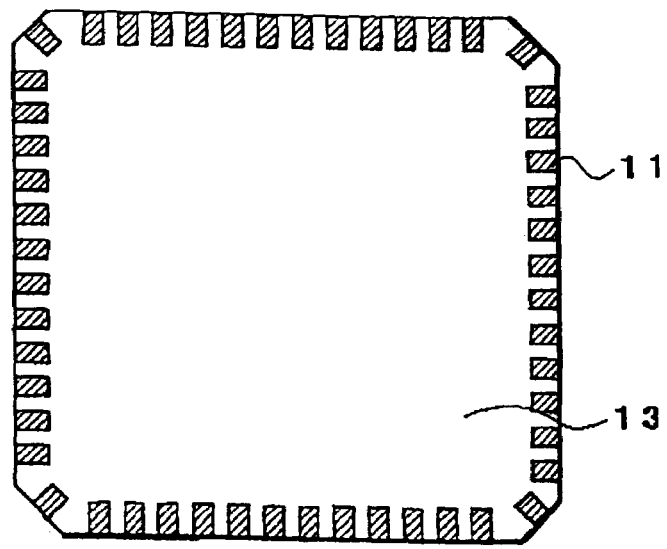

The configuration and a manufacturing method of a semiconductor device 10A of this embodiment shall now be described with reference to FIGS. 1 through 7. First, the configuration of optical semiconductor device 10A shall be described with reference to FIGS. 1 through 3. FIG. 1A is a perspective view of optical semiconductor device 10A and FIG. 1B is a rear view thereof. FIGS. 2A, 2B, 3A, and 3B are sectional views along line X-X of FIG. 1A.

Optical semiconductor device 10A has a configuration such that in optical semiconductor device 10A, wherein an optical semiconductor element 14, having a light receiving part or a light emitting part, is sealed in a sealing resin 13, a cover layer 12, covering the top surface of optical semiconductor element 14, is exposed from the top surface of sealing resin 13. To be more detailed, this embodiment's optical semiconductor device 10A comprises optical semiconductor element 14, having a light receiving part or a light emitting part, cover layer 12, covering the top surface of optical semiconductor element 14, a land 16, onto which optical semiconductor element 14 is affixed, leads 11, electrically connected to optical semiconductor element 14 via metal wires 15 and forming external electrodes, and sealing resin 13, sealing optical semiconductor element 14, metal wires 15, land 16, and leads 11, and has a configuration wherein cover layer 12 is exposed from sealing resin 13. Such a configuration shall now be described.

As shown in FIG. 1A, cover layer 12 is arranged to be exposed from the top surface of sealing resin 13. Here, optical semiconductor element 14 is positioned near a central part of optical semiconductor device 10A and cover layer 12, which covers its top surface, is exposed from sealing resin 13. As the material of cover layer 12, a material, which is transparent to the light that is input into optical semiconductor element 14 or the light that is output from optical semiconductor element 14, is used. For example, if optical semiconductor element 14 is an element that detects visible rays, a material that is transparent to visible rays is employed as cover layer 12. Concretely, glass or an acrylic plate, etc., may be used as cover layer 12. Furthermore, in the case where optical semiconductor element 14 is an image pickup element, such as a CCD image sensor, etc., a filter, etc., are added.

As shown in FIG. 1B, partially exposed leads 11 form external electrodes at peripheral parts of the rear surface of optical semiconductor device 10A. That is, cover layer 12 is exposed at the top surface of optical semiconductor device 10A and external electrode terminals, comprising leads 11, are exposed from the rear surface.

Figure 2A:
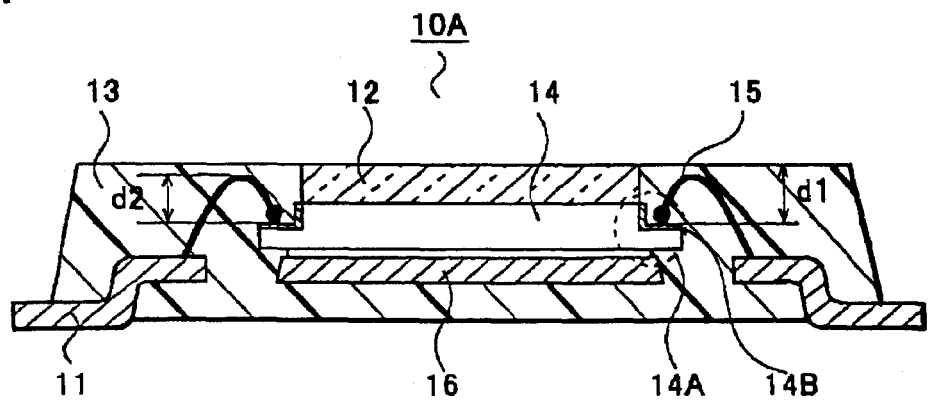
FIG. 2 is a sectional view (A), a sectional view (B), and a sectional view (C) showing a semiconductor device of a preferred embodiment.

As shown in FIG. 2A, optical semiconductor element 14 is affixed onto a land 16. Optical semiconductor element 14 and leads 11 are electrically connected via metal wires 15. Here, a light receiving element or a light emitting element may be employed a soptical semiconductor element 14. As alight receiving element, a solid-state image pickup element, such as a CCD (Charge Coupled Device) image sensor, CMOS (Complementary Metal Oxide Semiconductor) image sensor, etc., or a photosensor, such as a photodiode, phototransistor, etc., may be employed as optical semiconductor element 14. As a light emitting element, a light emitting diode or a semiconductor laser may be employed as optical semiconductor element 14. Furthermore, a MEMS (Micro Electro Mechanical System) may be used in place of optical semiconductor element 14.

Indented part 14A is a region at which a peripheral part of optical semiconductor element 14 is indented uniformly and has a metal wiring 14B, comprising aplating film, etc., formed thereon. Abonding pad, comprising metal wiring 14B, is formed on the top surface of indented part 14A, and a metal wire 15 is connected to this bonding pad. The merit of providing indented parts 14A shall now be described. With this embodiment, cover layer 12, which covers optical semiconductor element 14, is exposed from the top surface of sealing resin 13. The distance from the upper surface of semiconductor element 14 to the top surface of sealing resin 13 is thus equivalent to the thickness (d1) of cover layer 12. Thus when the height (d2) of the bulge of metal wires 15 is higher than the thickness (d1) of cover layer 12, the securing of a height of d2 becomes an issue. Here, this issue is resolved by providing the indented parts 14A and wire bonding metal wires 15 at these indented parts 14A. That is, forming regions for metal wires 15 are secured by setting the sum length of the thickness (d1) of cover layer 12 and the depth of each indented part 14A to be longer than the height (d2) of the bulge of each metal wire 15. A configuration from which indented parts 14A are eliminated is possible in the case where the thickness (d1) of cover layer 12 is made thicker than the height (d2) of the bulge of metal wire 15.

A structure with which the side surfaces of cover layer 12 are inclined is also possible, and in this case, the adhesion of cover layer 12 with sealing resin 13 can be improved by an anchor effect.

The material of land 16 is selected in consideration of solder material attachment property, bonding property, and plating property, and this material comprises a metal having Cu as the principal material, a metal having Al as the principal material, or an alloy, such as Fe—Ni, etc. Here, land 16 is positioned at a central part of optical semiconductor device 10A and optical semiconductor element 14 is affixed via an adhesive agent onto the top surface thereof. The humidity resistance of the device is improved by the rear surface of land 16 being covered by sealing resin 13. The rear surface of land 16 may also be exposed from sealing resin 13. The property of radiation of the heat generated by optical semiconductor element 14 can thereby be improved.

A plurality of leads 11 are provided so as to surround land 16 and each lead extends from a vicinity of land 16 to a peripheral part of optical semiconductor device 10A. The end part of each lead 11 that is closer to land 16 is electrically connected via a metal wire 15 to optical semiconductor element 14. The rear surface of the vicinity of the other end of each lead 11 is exposed from sealing resin 13 and forms an external electrode. Here, lead 11 is formed in a gull-wing shape.

Sealing resin 13 seals land 16, leads 11, metal wires 15, optical semiconductor element 14, and cover layer 12 while leaving the top surface of cover layer 12 exposed. For improvement of mechanical strength and improvement of humidity resistance, sealing resin 13 has an inorganic filler mixed therein and is made light-blocking. For example, an aluminum compound, a calcium compound, a potassium compound, a magnesium compound, or a silicon compound may be employed as the inorganic filler. Also, as the resin to be used as sealing resin 13, both thermoplastic resins and thermosetting resins may be generally employed. Examples of thermoplastic resins that can be employed with respect to this embodiment include ABS resins, polypropylene, polyethylene, polystyrene, acrylic resins, polyethylene terephthalate, polyphenylene ether, nylon, polyamide, polycarbonate, polyacetal, polybutylene terephthalate, polyphenylene sulfide, polyether ether ketone, liquid crystal polymers, fluororesins, urethane resins, and elastomers. Examples of thermosetting resins that can be employed with respect this embodiment include urea, phenol, melamine, furan, alkyd, unsaturated polyester, diarylphthalate, epoxy, and silicon resins and polyurethane.

Figure 2B:
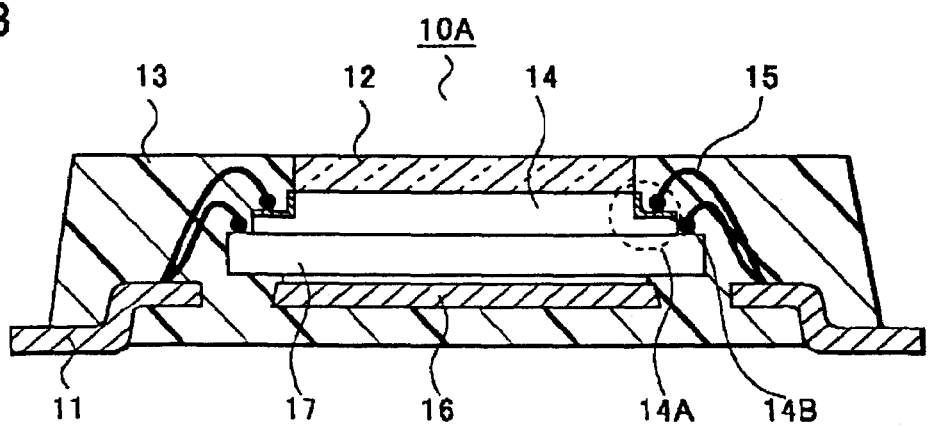

The configuration of a semiconductor device 10A of another form shall now described using FIG. 2B. Optical semiconductor device 10A shown in this figure is similar in basic configuration as that described above, the difference being that a semiconductor element 17 is provided. This difference shall now be described in detail.

Semiconductor element 17 is affixed onto a land 16 and furthermore, an optical semiconductor element 14 is disposed above this semiconductor element 17. Semiconductor element 17 and leads 11 are electrically connected via metal wires 15. Semiconductor element 17 and optical semiconductor element 14 can thus be connected electrically via metal wires 15 and leads 11. As semiconductor element 17, an element for control of optical semiconductor element 14 or for processing of electrical signals output from semiconductor element 14 may be employed.

In a case where optical semiconductor element 14 is a CCD image sensor or a CMOS image sensor, a driver circuit for driving a CCD, an A/D converter, a signal processing circuit, etc., may be formed in semiconductor element 17. Furthermore, a circuit with an image compression function or a color correction function may be formed in semiconductor element 17. In a case where optical semiconductor element 14 is a light emitting diode or other light emitting element, a circuit for controlling this light emitting element may be formed in semiconductor element 17. By incorporating such a semiconductor element 17 in addition to optical semiconductor element 14 in semiconductor device 10A, optical semiconductor device 10A can be improved in added value.

Figure 2C:
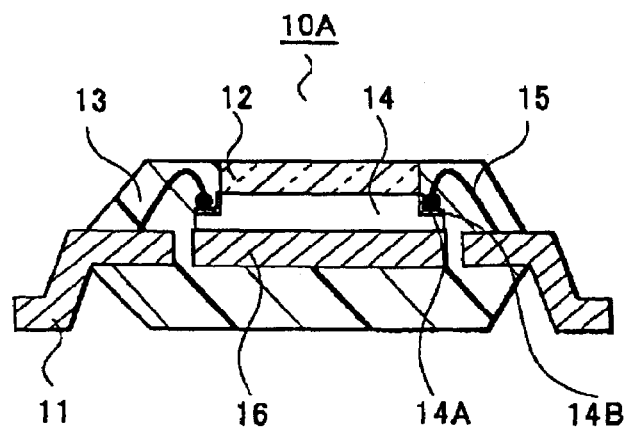

Referring to FIG. 2C, here, leads 11 are embedded in a sealing resin 13 at locations of connection with metal wires 15 and leads 11 are lead out from side parts of sealing resin 13.

Figure 3A:
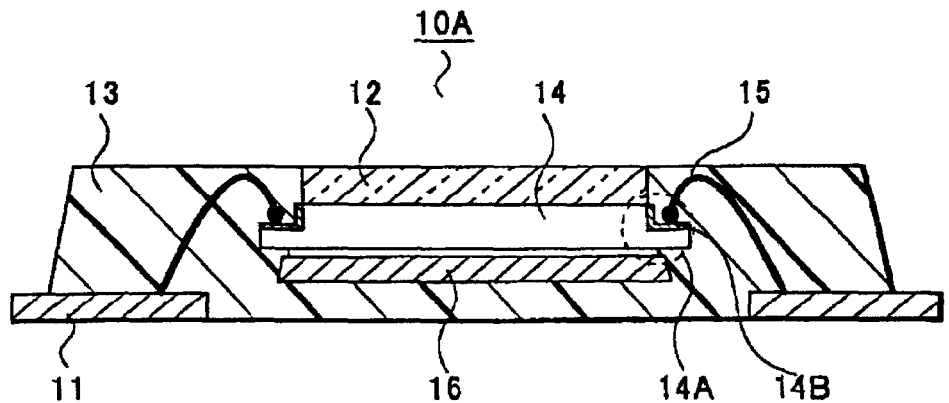
FIG. 3 is a sectional view (A), a sectional view (B), and a sectional view (C) showing a semiconductor device of a preferred embodiment.
Figure 3B:
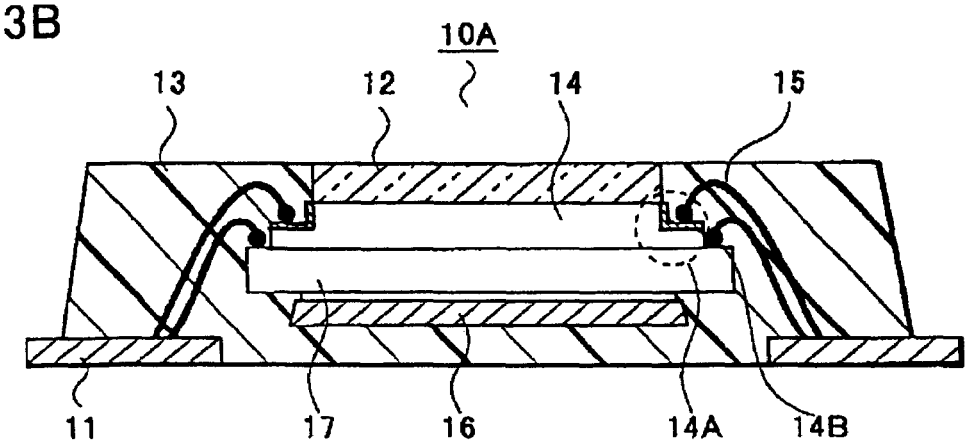

The configurations of other forms of optical semiconductor device 10A shall now be described with reference to FIG. 3. Optical semiconductor devices 10A shown in this Figure are similar in basic configuration to that described with reference to FIG. 1, the difference being that leads 11 are formed to be flat. In FIG. 3A, only an optical semiconductor element 14 is incorporated in optical semiconductor device 10A, and in FIG. 3B, a semiconductor element 17 is incorporated in addition to optical semiconductor element 14.

Figure 3C:
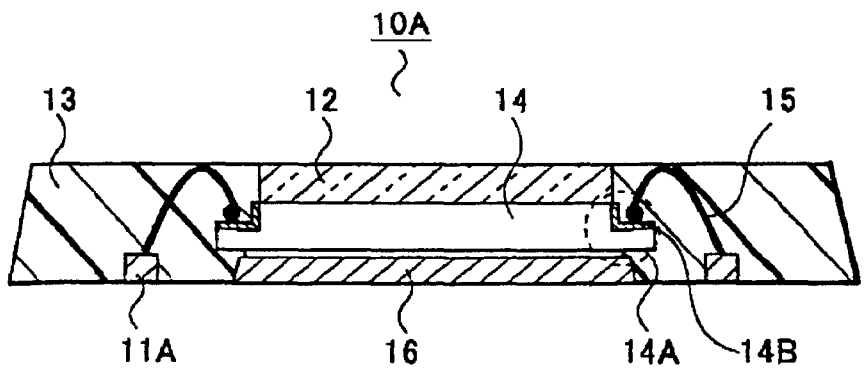

Referring to FIG. 3C, here, an optical semiconductor element 14 and pads 11A are connected by metal wires 15 and the rear surfaces of pads 11A are exposed from the rear surface of sealing resin 13 and form external electrodes.

A method of manufacturing this embodiment's optical semiconductor device 10A shall now be described with reference to FIGS. 4 to 7. Optical semiconductor device 10A is manufactured by an optical semiconductor device manufacturing method comprising the step of sealing optical semiconductor element 14, having a light receiving part of a light emitting part, in sealing resin 13, and in this method, the top surface of the cover layer, covering the top surface of the optical semiconductor element, is protected with a sheet and the sealing by the sealing resin is performed to expose the cover layer from the sealing resin. To be more detailed, the method of manufacturing optical semiconductor device 10A comprises the steps of: processing a substrate 41, comprising a conductive member, and providing lands 16 and leads 11 on substrate 41; adhering the lower surface of the entirety of substrate 41 onto a first sheet 51A; affixing optical semiconductor elements 14, each having cover layer 12 on the top surface, onto lands 16 of substrate 41; protecting the upper surfaces of cover layers 12 with a second sheet 51B; and sealing lands 16, leads 11, and optical semiconductor elements 14 on substrate 41 with sealing resin 13. The details of the steps shall now be described with reference to the drawings.

Figure 4:
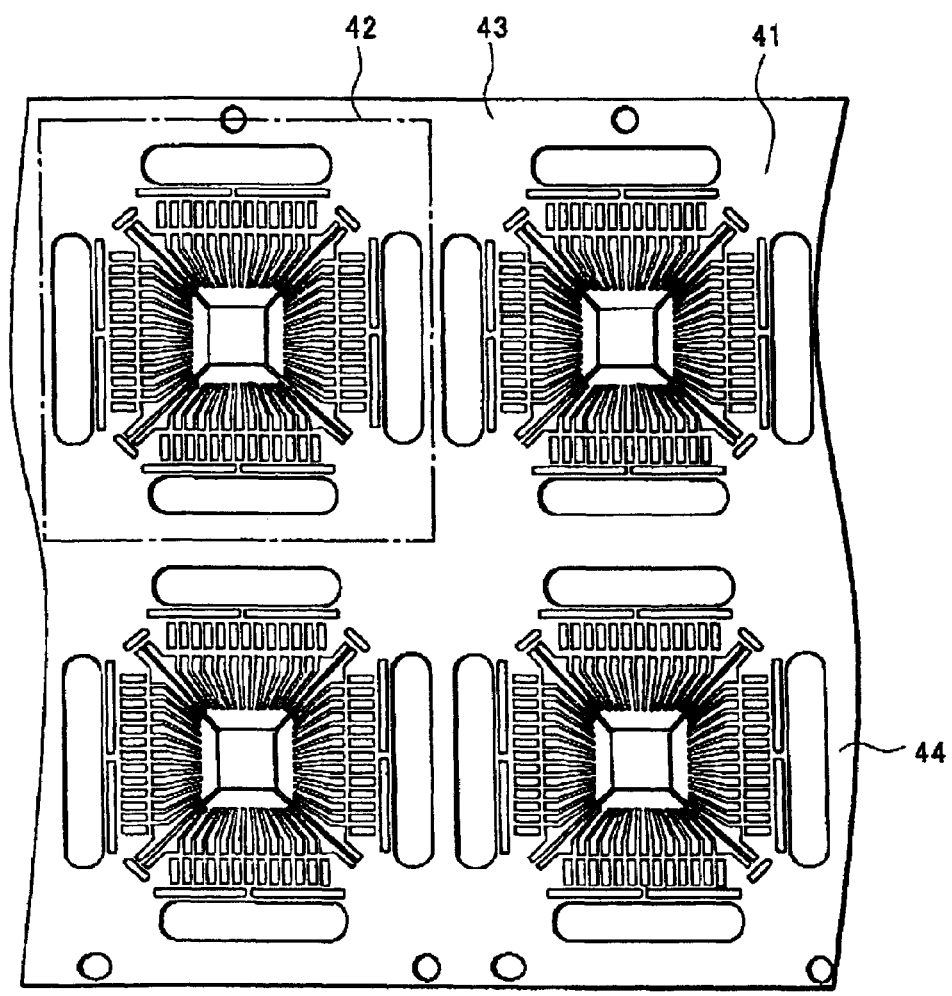
FIG. 4 is a plan view showing a semiconductor device manufacturing method of a preferred embodiment.

First as shown in FIG. 4, substrate 41, comprising a conductive member, is processed and lands 16 and leads 11 are disposed on substrate 41. Substrate 41 comprises, for example, a plate-like body having copper with a thickness of approximately 100 to 250 μm as the principal component. However, a metal having Fe—Ni as the principal component and other metal materials may also be used instead. A plurality of mounting parts 42, each defining a unit corresponding to a single optical semiconductor device and being indicated by alternate long and short dash lines, are formed in matrix form on substrate 41. Though in the Figure, four mounting parts are provided, it is sufficient that at least one mounting part be provided. Each mounting part 42 is surrounded by a pair of first connecting strips 43, which extend in the left/right direction with respect to the paper surface, and a pair of second connecting strips 44, which extend in the up/down direction with respect to the paper surface. The plurality of mounting parts 42 are disposed on a single substrate 41 by means of these first and second connecting strips 43 and 44.

Figure 5A:
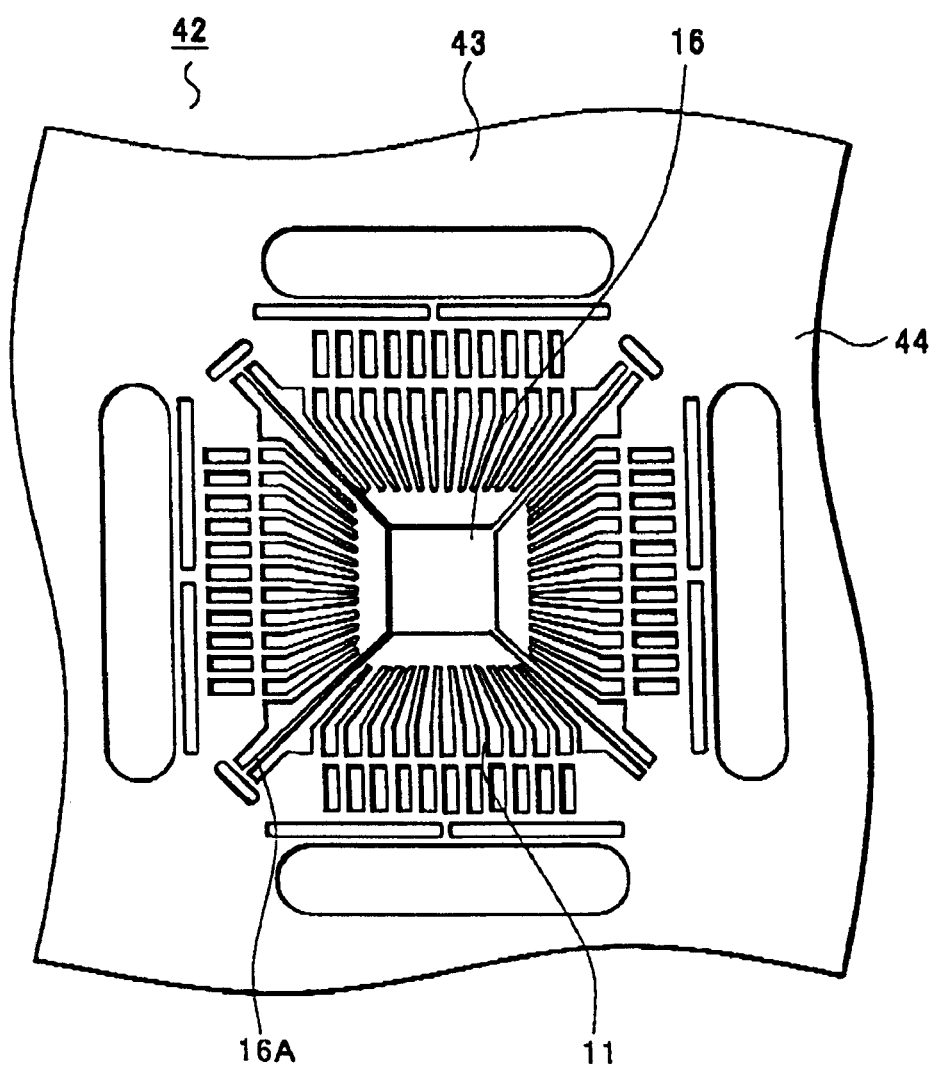
FIG. 5 is a plan view (A) and a sectional view (B) showing a semiconductor device manufacturing method of a preferred embodiment.

FIG. 5A is an enlarged view of a mounting part 42 shown in FIG. 4. As illustrated, mounting part 42 has mainly a land 16, suspension leads 16A, which support land 16, and a plurality of leads 11. Here, leads 11 have one of their ends positioned near the four sides of land 16 and have the other ends extending to first and second connecting strips 43 and 44 so as to surround the four sides.

Figure 5B:
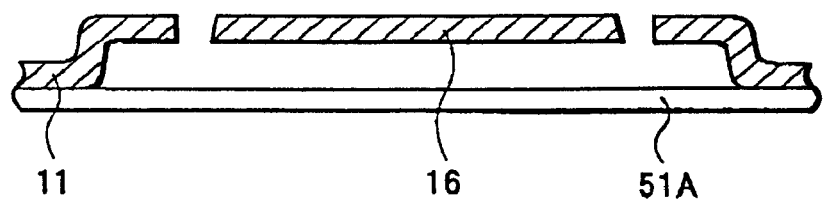

Next, as shown in FIG. 5B, the lower surface of the entire substrate 41 is adhered onto first sheet 51A. As first sheet 51A, a material, which is low in expansion and contraction in response to mechanical force and heat, is selected. Though, for example, a PET (polyethylene terephthalate) material is used in the present embodiment, another material may be used as long as it satisfies the above condition.

Figure 6A:
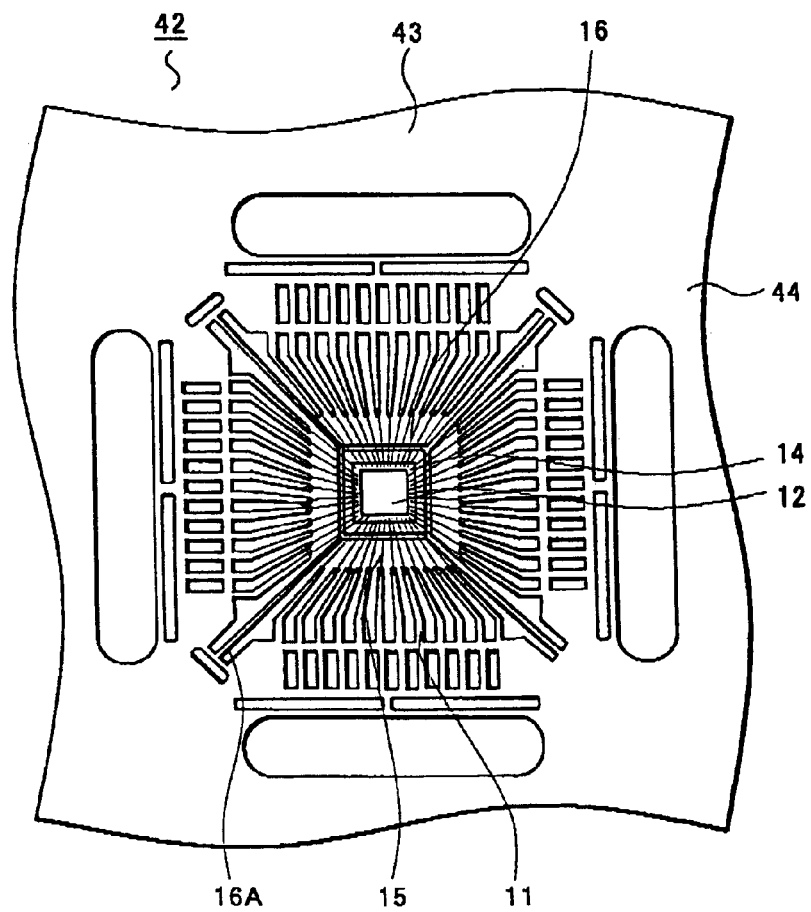
FIG. 6 is a plan view (A) and a sectional view (B) showing a semiconductor device manufacturing method of a preferred embodiment.
Figure 6B:
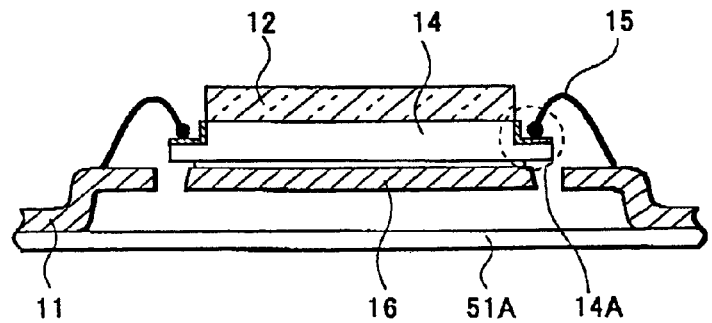

Next, optical semiconductor element 14, having cover layer 12 on the top surface, is affixed onto land 16 of substrate 41 as shown in FIG. 6. FIG. 6A is a plan view of a single mounting part 42 in this step and FIG. 6B is a sectional view thereof.

Optical semiconductor element 14, provided with cover layer 12 on the top surface, is affixed onto the upper part of land 16 by means of an adhesive agent. Optical semiconductor element 14 and leads 11 are then connected electrically by means of metal wires 15. Indented parts 14A are provided at peripheral parts of optical semiconductor element 14, and bonding pads, to which metal wires 15 are connected, are formed at these indented parts 14A.

Figure 7A:
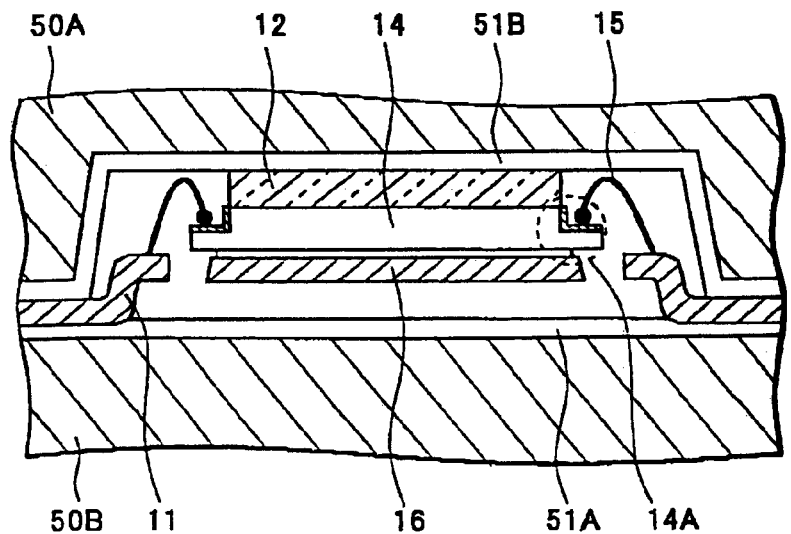
FIG. 7 is a sectional view (A) and a sectional view (B) showing a semiconductor device manufacturing method of a preferred embodiment.
Figure 7B:
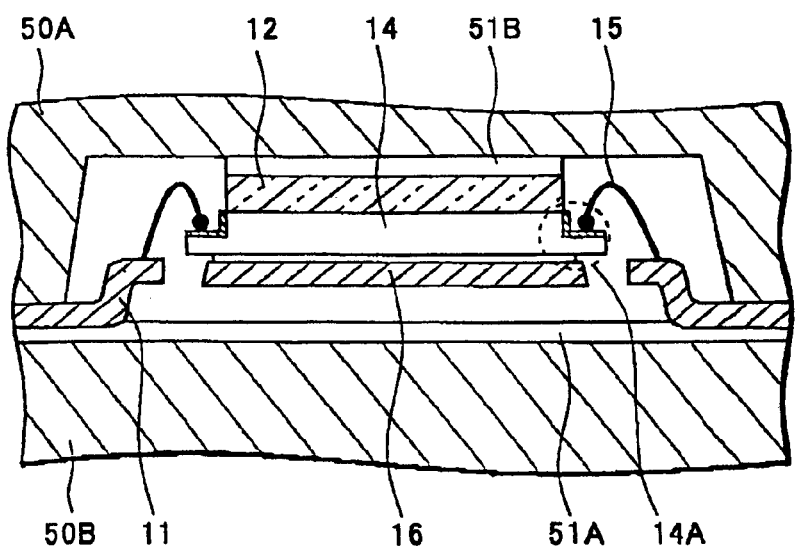

The upper surface of each cover layer 12 is then protected with second sheet 51B and thereafter, land 16, leads 11, and optical semiconductor element 14 on substrate 41 are sealed with sealing resin 13 as shown in FIG. 7. FIG. 7A is a sectional view for explaining this step and FIG. 7B is a sectional view for explaining another form of this step.

Referring to FIG. 7A, resin sealing is performed in this step by using molding dies comprising an upper die 50A and a lower die 50B. Transfer molding using a thermosetting resin, injection molding using a thermoplastic resin, etc., may be employed as the sealing method. First sheet 51A, which is adhered onto the lower surface of substrate 41, is put in contact with lower die 50B. Also, in order to maintain the flatness of first sheet 51A, first sheet 51A may be fixed with a suction means provided in lower die 50B.

Second sheet 51B serves the role of protecting the upper surface of cover layer 12 so that it will not become covered with sealing resin 13. The upper surface of second sheet 51B covers substantially the entirety of the inner walls of upper die 50. Furthermore, the lower surface of second sheet 51B is put in contact with the upper surface of cover layer 12. The sealing step is performed by injecting sealing resin 13 from a gate provided in the die in this state. After the sealing step is completed, first sheet 51A and second sheet 51B are peeled off.

Though the same sheet as the above-described first sheet may be used as second sheet 51B, another material may be used as longs the conditions of heat resistance, etc., are satisfied. By applying an adhesive agent to the surface of second sheet 51B that comes in contact with cover layer 12, the adhesion of second sheet 51B to cover layer 12 can be improved and sealing resin 13 can be prevented from entering into the interface between the two. Also in order to improve the force of adhesion between the inner walls of upper die 50A and second sheet 51B, upper die 50A may be provided with a suction means and second sheet 51B may be held by means of this suction means.

Another way for carrying out the sealing method shall now be described with reference to FIG. 7B. Here, second sheet 51B is provided only at locations corresponding to the upper surface of cover layer 12. Thus when second sheet 51B is removed after the completion of the resin sealing step, indented parts are formed at locations at which second sheet 51B was provided.

Though in the above description, resin sealing is performed using an individual cavity for each mounting part 42, it is also possible to perform resin sealing by using one cavity for a plurality of mounting parts 42 and thereafter performing division into the individual mounting parts 42 by dicing, etc. Such a process is referred to in general as MAP (Multi Area Package).

After the above-described step, a mold curing step for hardening the resin, a plating step of covering the leads 11 exposed to the exterior with a plating film, a dicing step of separating the respective mounting parts 42, and a measurement step of measuring the electrical characteristics and making pass/fail judgments are performed to manufacture optical semiconductor device 10A.

The advantage of this preferred embodiment is that cover layer 12, covering the upper surface of optical semiconductor element 14, is exposed from sealing resin 13 as shown in FIG. 1. In other words, optical semiconductor element 14 is exposed from sealing resin 13 via cover layer 12. Thus in comparison to the prior-art example, with which the entirety is sealed in a transparent resin, sealing resin 13 can be formed thinly and the thickness of the entire device can be made thin. Furthermore, since optical semiconductor element 14 is exposed to the exterior via cover layer 12, in a case where optical semiconductor element 14 is a light receiving element, optical signals that are input from the exterior can be received with the attenuation thereof being restrained. Also, in a case where optical semiconductor element 14 is a light receiving element, the attenuation of the emitted optical signals can be restrained.

Another advantage of this preferred embodiment is that optical semiconductor device 10 is configured using a sealing resin having a filler mixed therein. An optical semiconductor device that is excellent in mechanical strength and humidity resistance can thus be obtained.

Second Embodiment

Figure 9A:
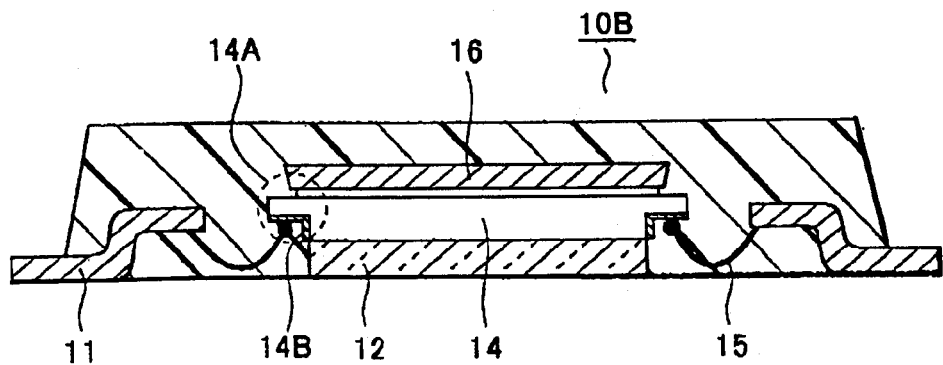
FIG. 9 is a sectional view (A), a sectional view (B), and a sectional view (C) showing a semiconductor device of a preferred embodiment.
Figure 9B:
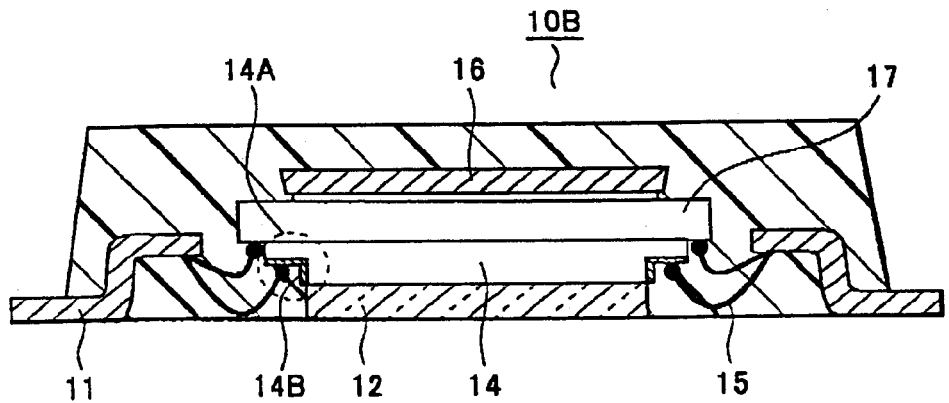
Figure 9C:
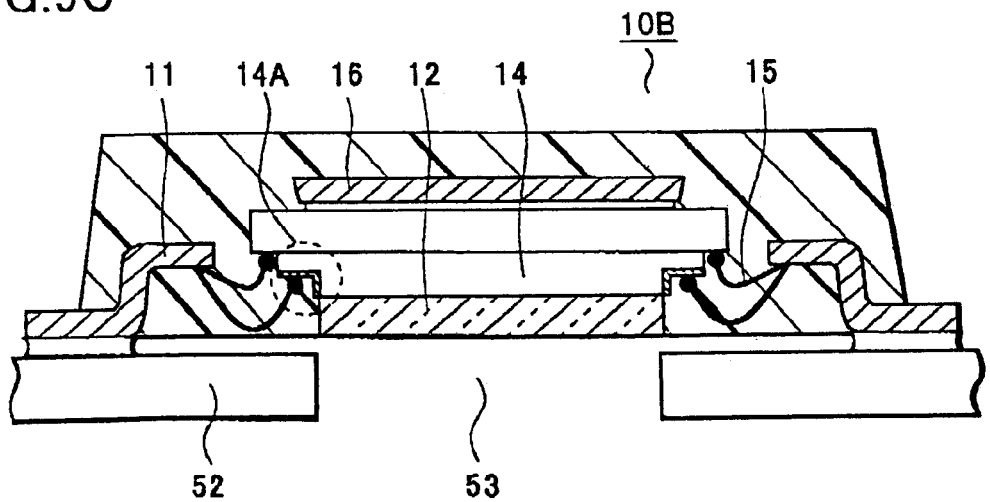
Figure 10:
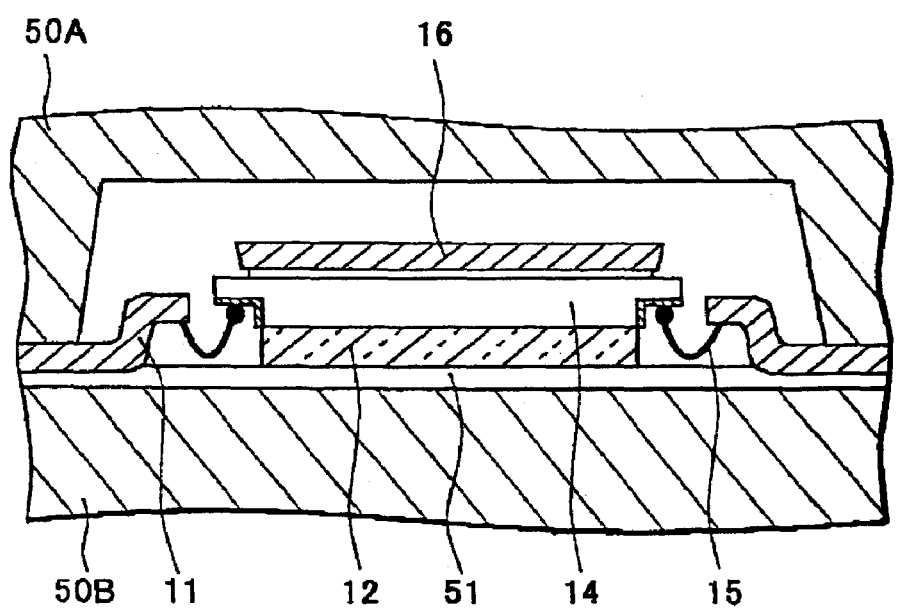
FIG. 10 is a sectional view showing a semiconductor device manufacturing method of preferred a embodiment.

The configuration and a manufacturing method of a semiconductor device 10B of, this embodiment shall now be described with reference to FIGS. 8 through 10. First, the configuration of optical semiconductor device 10B of this embodiment shall be described with reference to FIGS. 8 and 9.

Figure 8A:
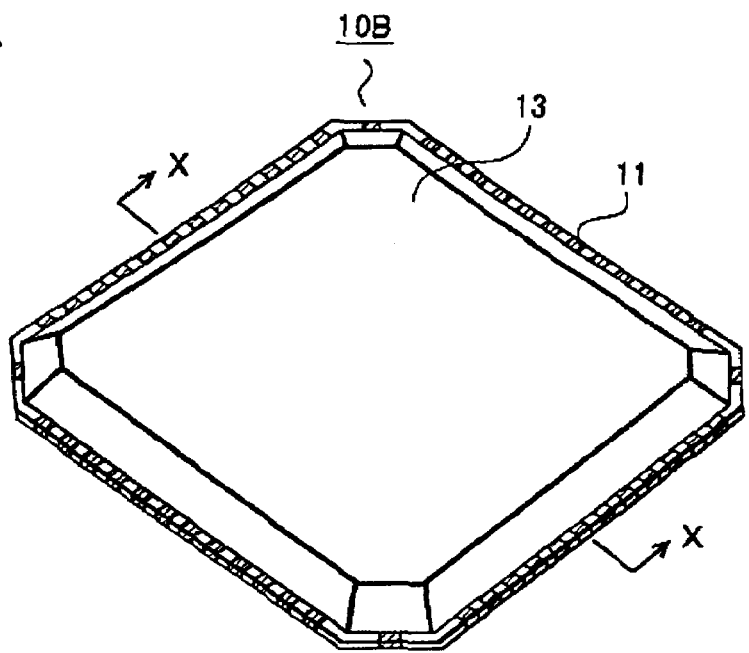
FIG. 8 is a perspective view (A) and a rearview (B) showing a semiconductor device of preferred a embodiment.
Figure 8B:
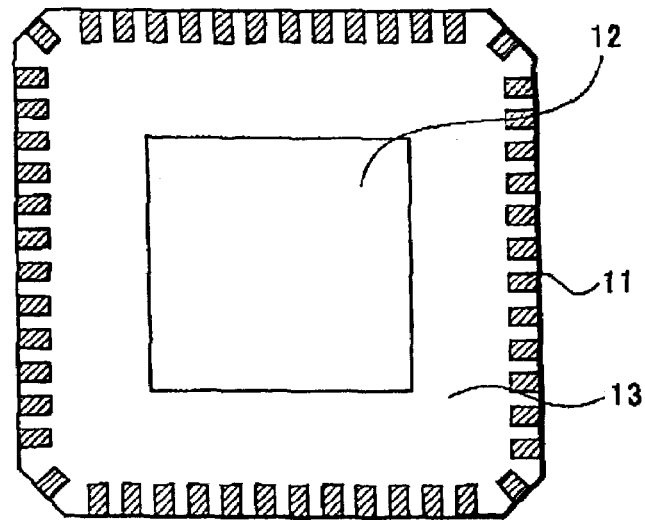

FIG. 8A is a perspective view of optical semiconductor device 10B and FIG. 8B is a rear view thereof. As is clear from these Figures, optical semiconductor device 10B is the same in basic configuration as optical semiconductor device 10A, which was described as the first embodiment, the difference being that a cover layer 12 is exposed from the rear surface of optical semiconductor device 10B. Concretely, cover layer 12 is exposed from a sealing resin 13 at the surface at which leads 11 are exposed and form external electrodes.

The cross-sectional structure of optical semiconductor device 10B shall now be described with reference to FIG. 9. FIGS. 9A and 9B are sectional views along line X-X of FIG. 8A.

As shown in FIG. 9A, optical semiconductor element 14 is affixed onto the lower surface of a land 16. Optical semiconductor element 14 and leads 11 are connected by metal wires 15, and here, metal wires 15 have the ends at one side thereof connected to the lower surfaces of leads 11. The other ends of metal wires 15 are connected to metal wirings 14B at indented parts 14A provided at peripheral parts of semiconductor element 14.

Referring to FIG. 9B, here in addition to an optical semiconductor element 14, a semiconductor element 14. is also incorporated in an optical semiconductor device 10B. The types of circuits formed in semiconductor element 17 and the effects of incorporating semiconductor element 17 are the same as those of the first embodiment.

The mounting structure of the above-described optical semiconductor 10B shall now be described with reference to FIG. 9C. Optical semiconductor device 10B is affixed onto a substrate 52 via soft solder or other solder material. Concretely, conductive paths, provided on substrate 52, and the exposed parts of leads 11 are connected by solder material. Also, in order to enable input/output of light between optical semiconductor element 14 and the exterior, substrate 52 has an opening 53 provided in correspondence to the position and size of optical semiconductor element 14.

A method of manufacturing the above-described optical semiconductor device 10B shall now be described with reference to FIG. 10. Here, the description of steps, which overlap with those of the method of manufacturing optical semiconductor device 10A that was described as the first embodiment, shall be omitted. Concretely, the step of forming lands 16 and leads 11 on a conductive substrate 41, the step of adhering a first sheet onto substrate 41, and the step of affixing optical semiconductor element 14 and wire bonding metal wires 15 are basically the same as those of the first embodiment. Here, the adhering of a sheet 51 is performed after the affixing of semiconductor element 14 and the wire bonding. Furthermore, whereas with the first embodiment, the two sheets of first sheet 51A and second sheet 51B are used to perform the step of mold sealing, here, the single sheet 51 is used to perform the mold sealing step.

The mold sealing step shall now be described with reference to FIG. 10. Sheet 51 is adhered onto the lower surfaces of parts of leads 11 that are exposed to the exterior. Sheet 51 is supported by a lower die 50B. Furthermore, cover layer 12, which covers semiconductor element 14, is also adhered onto sheet 51. Thus in this step, cover layer 12 is also adhered onto sheet 51, onto which substrate 41, having leads 11 and land 16 formed thereon, is adhered. Sealing by sealing resin 13 is performed in this state. A mold sealing step using a single sheet can thus be realized.

After the above-described step, a mold curing step of hardening the resin, a plating step of covering the externally exposed leads 11 with a plating film, a dicing step of separating the respective mounting parts 42, and a measurement step of measuring the electrical characteristics and making pass/fail judgments are performed to manufacture optical semiconductor device 10B.

Third Embodiment

The configuration and a method of manufacturing a semiconductor device 10C of this embodiment shall now be described with reference to FIGS. 11 and 12. First, the configuration of optical semiconductor device 10C of this embodiment shall be described with reference to FIG. 11.

As shown in FIG. 11, optical semiconductor device 10C comprises an optical semiconductor element 14, having a light receiving part or a light emitting part, a cover layer 12, covering the top surface of optical semiconductor element 14, a mounting substrate 18, on the top surface of which conductive paths 20 are formed and optical semiconductor element 14 is affixed, metal wires 15, electrically connecting optical semiconductor element 14 and conductive paths 20, and sealing resin 13, sealing optical semiconductor element 14 and metal wires 15, and has a configuration where cover layer 12 is exposed from sealing resin 13.

As described above, the basic configuration of optical semiconductor device 10C of this embodiment is the same as that described with the first and second embodiments, the difference being that mounting substrate 18 is used as the substrate (interposer).

Figure 11A:
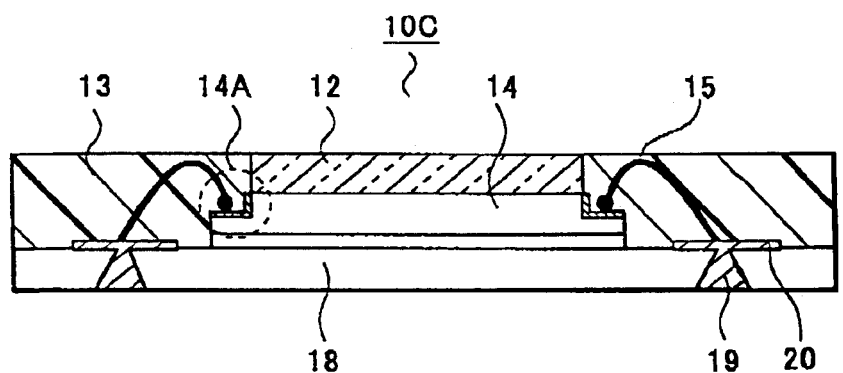
FIG. 11 is a sectional view (A) and a sectional view (B) showing a semiconductor device of a preferred embodiment.

As shown in FIG. 11A, optical semiconductor element 14 is affixed onto the upper surface of mounting substrate 18 via an adhesive agent. On the top surface of mounting substrate 18, conductive paths 20, which form bonding pads, etc., are provided and external electrodes 19 pass through mounting substrate 18 and are exposed at the lower surface. A plurality of layers of wiring that are laminated across insulating members may also be provided.

Figure 11B:
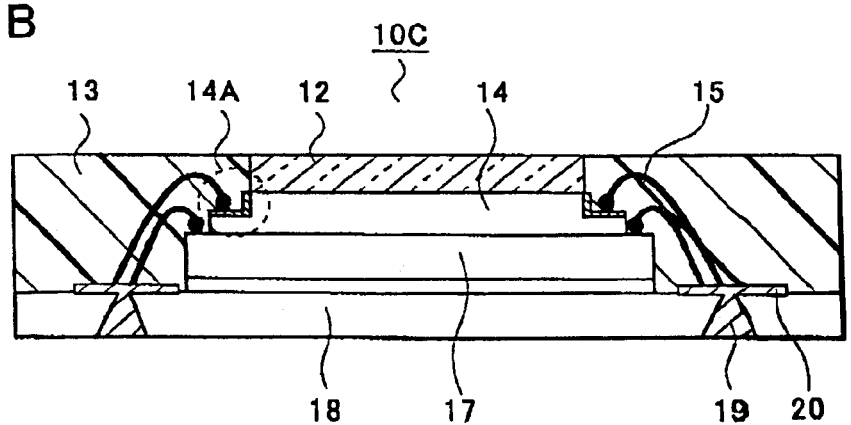

Referring to FIG. 11B, here in addition to optical semiconductor element 14, a semiconductor element 17 is incorporated in optical semiconductor device 10C.

Figure 12A:
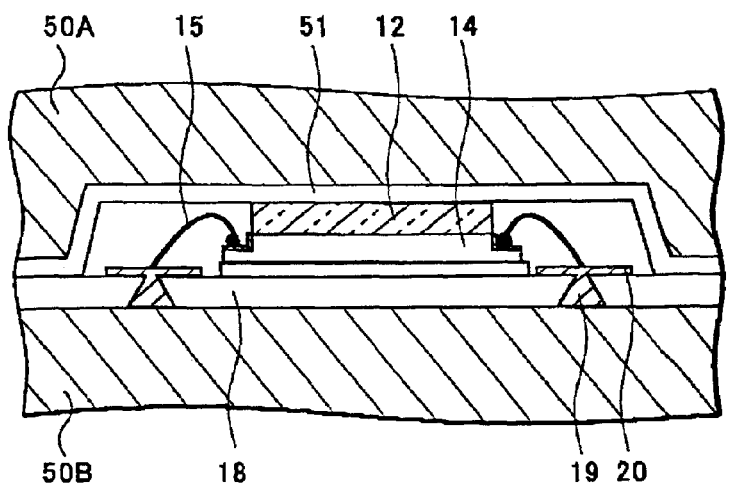
FIG. 12 is a sectional view (A) and a sectional view (B) showing a semiconductor device manufacturing method of a preferred embodiment.

A method of manufacturing optical semiconductor device 10C shall now be described with reference to FIG. 12. As shown in FIG. 12A, optical semiconductor element 14 is affixed onto mounting substrate 18, and conductive paths 20 and optical semiconductor element 14 are connected via metal wires 15. Thereafter, mounting substrate 18, onto which optical semiconductor element 14 has been affixed, is set in a lower die 50B. The upper surface of a sheet 51 is put in contact with substantially all regions of the inner walls of an upper die 50A and the lower surface of sheet 51 contacts cover layer 12. Sealing by sealing resin 13 is performed in this state. Since mounting substrate 18 is put in overall contact with lower die 50B, a mold sealing step using a single sheet 51 is performed here.

Figure 12B:
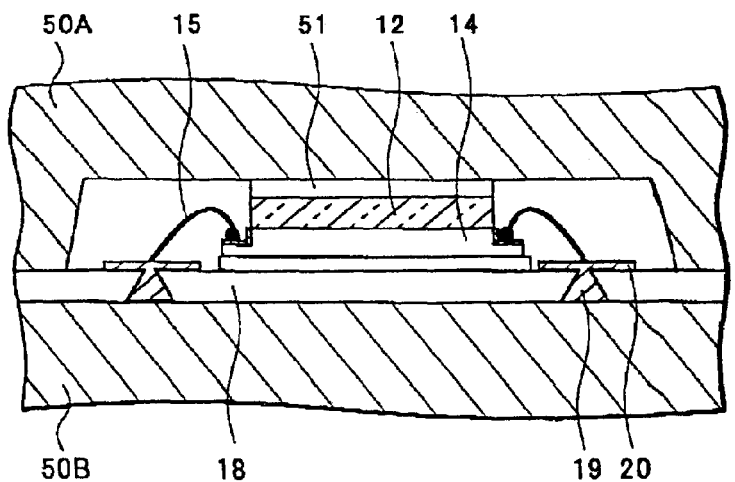

Referring to FIG. 12B, here, a sheet 51 of approximately the same size as cover layer 12 is used to protect cover layer 12. After performing sealing with sealing resin 13, sheet 51 is peeled off. Thus with respect to the upper surface formed of sealing resin 13, upper surface of cover layer 12 that is exposed takes on a form that is indented towards the inner side by an amount corresponding to the thickness of sheet 51.

After the above-described step, a mold curing step of hardening the resin and a measurement step of measuring the electrical characteristics and making pass/fail judgments are performed to manufacture optical semiconductor device 10C.

Fourth Embodiment

The configuration and a method of manufacturing a semiconductor device 10D of this embodiment shall now be described with reference to FIGS. 13 through 16. First, the configuration of optical semiconductor device 10D of this embodiment shall be described with reference to FIG. 13.

Figure 13A:
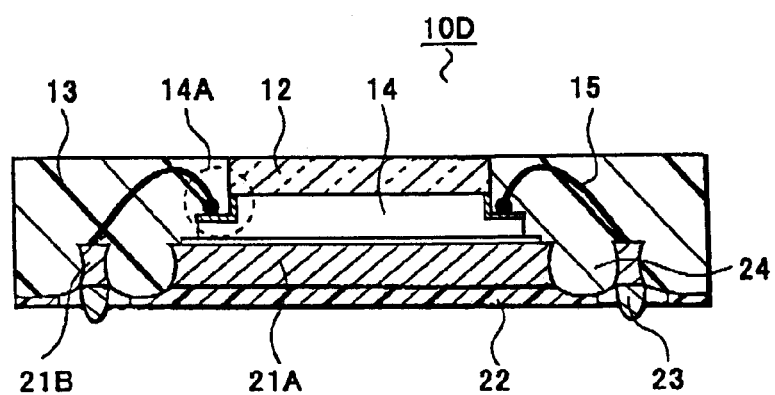
FIG. 13 is a sectional view (A) and a sectional view (B) showing a semiconductor device of a preferred embodiment.

As shown in FIG. 13A, optical semiconductor device 10D comprises an optical semiconductor element 14, having a light receiving part or a light emitting part, a cover layer 12, covering the top surface of optical semiconductor element 14, conductive patterns 21, separated by separation grooves 24 and having an optical semiconductor element 14 affixed on an upper part thereof, and a sealing resin 13, covering optical semiconductor element 14 and conductive patterns and filled in separation grooves 24 while leaving the rear surfaces of conductive patterns 21 exposed, and has a configuration wherein cover layer 12 is exposed from sealing resin 13. These components shall now be described.

Conductive patterns 21 comprise a first conductive pattern 21A and second conductive patterns 21B. First conductive pattern 21A is formed to have the form of a land and optical semiconductor element 14 is mounted to the upper part thereof. Second conductive patterns 21B are disposed at locations close to first conductive pattern 21A and serve the role of bonding pads. External electrodes 23, formed of soft solder or other solder material, are disposed at the rear surfaces of second conductive patterns 21B.

The side surfaces of first conductive pattern 21A and second conductive patterns 21B have inwardly curving shapes. Thus by the fitting of the curved side surface parts of conductive patterns 21 with sealing resin 13, the binding force between the two is made strong.

The same types of resin cited in regard to the first embodiment may be employed as sealing resin 13. With the structure here, conductive patterns 21 are embedded in sealing resin 13. Optical semiconductor device 10D is thus supported in its entirety by the rigidity of sealing resin 13.

Since optical semiconductor element 14, cover layer 12, metal wires, and other components are the same as those of the above-described first embodiment, description thereof shall be omitted.

Figure 13B:
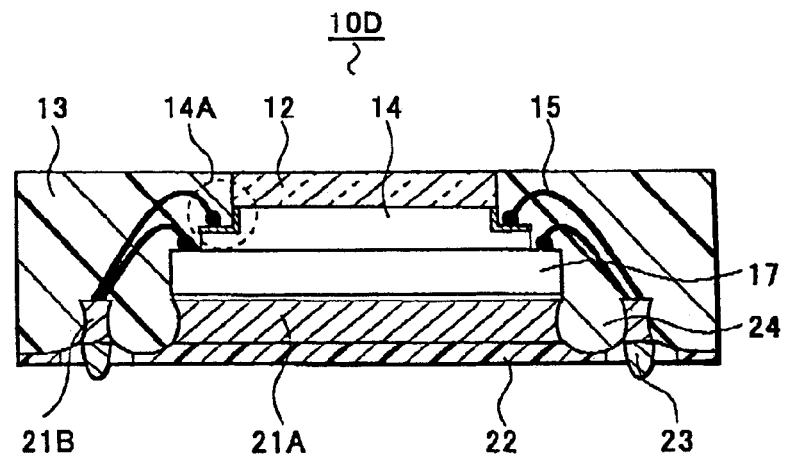

Referring to FIG. 13B, here in addition to optical semiconductor element 14, a semiconductor element 17 is incorporated in optical semiconductor device 10D.

A method of manufacturing optical semiconductor device 10D shall now be described with reference to FIGS. 14 through 16. The method of manufacturing optical semiconductor device 10D comprises the steps of forming conductive patterns 21 by forming separation grooves 24 in regions of a conductive foil 40 except locations that are to become conductive patterns 21, affixing optical semiconductor element 14, having cover layer 12 on its top surface, onto a conductive pattern 21, protecting the top surface of cover layer 12 with a sheet 51, forming sealing resin 13 so as to cover optical semiconductor element 14 and fill separation grooves 24, and electrically separating the respective conductive patterns 21. These steps shall now be described.

Figure 14A:
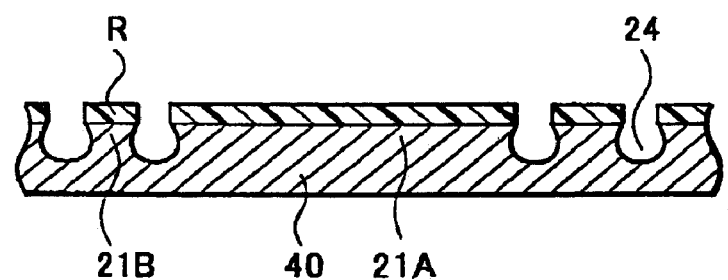
FIG. 14 is a sectional view (A) and a sectional view (B) showing a semiconductor device manufacturing method of a preferred embodiment.

As shown in FIG. 14A, conductive foil 40, having copper or aluminum as the principal component, is prepared and conductive patterns 21 are formed by forming separation grooves 24. Concretely, the top surfaces of locations of conductive foil 40 at which conductive patterns 21 are to be formed are covered with an etching resist R and wet etching is performed to form separation grooves 24. Since separation grooves 24, which are formed by etching, are provided with curved side surfaces and are made rough in surface, the adhesion with sealing resin 13 is made strong. After separation grooves 24 have been formed, resist R is peeled and removed. Also, a plating film is formed on the surfaces of conductive patterns 21.

Figure 14B:
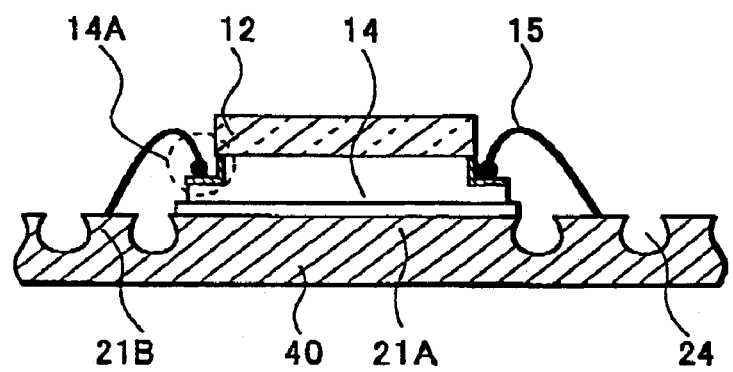

Optical semiconductor element 14 is then mounted onto a conductive pattern 21 as shown in FIG. 14B. Here, optical semiconductor element 14 is affixed onto conductive pattern 21A and optical semiconductor element 14 is electrically connected to second conductive patterns 21B by means of metal wires 15.

Then as shown in FIG. 15, the upper surface of the cover layer is protected with a second sheet and the sealing resin is formed so as to cover optical semiconductor element 14 and fill separation grooves 24. This step shall now be described.

Figure 15A:
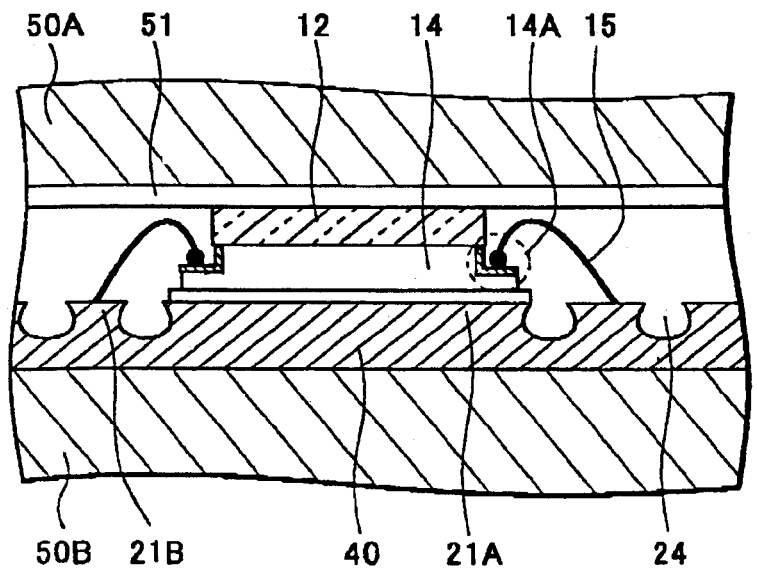
FIG. 15 is a sectional view (A) and a sectional view (B) showing a semiconductor device manufacturing method of a preferred embodiment.

As shown in FIG. 15A, conductive foil 40, having optical semiconductor element 14 affixed on the top surface, is set on a lower die 50B. The upper surface of a sheet 51 contacts substantially the entirety of the inner walls of an upper die 50A and the lower surface of sheet 51 contacts the upper surface of cover layer 12. Sealing resin 13 is formed in this state so as to cover optical semiconductor element 14 and metal wires 15 and fill separation grooves 24.

Figure 15B:
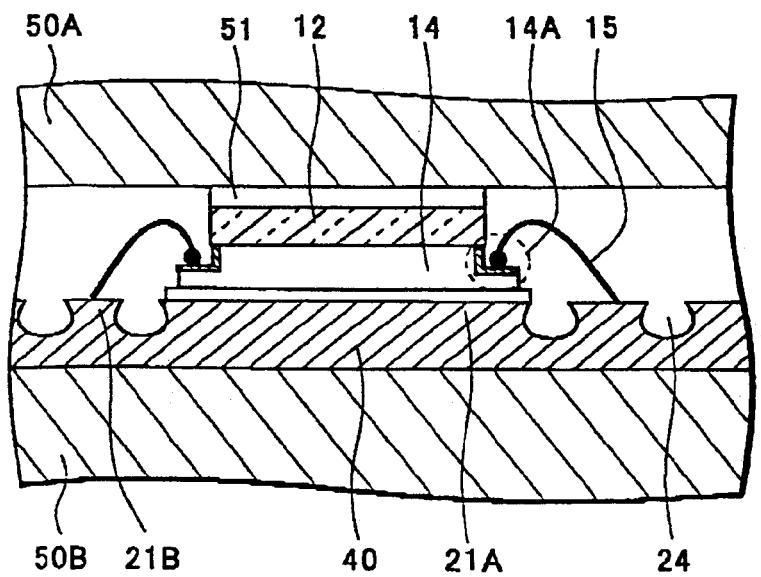

In FIG. 15B, a sheet 51 of approximately the same size as cover layer 12 is used to protect cover layer 12. The upper surface of cover layer 12 can be protected by this method as well.

The step of electrically separating the respective conductive patterns 21 shall now be described with reference to FIG. 16.

Figure 16A:
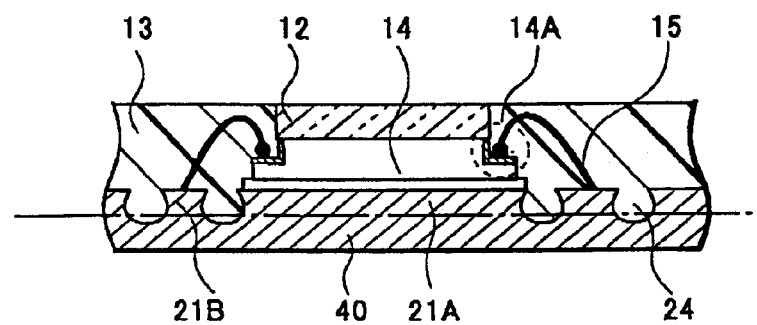
FIG. 16 is a sectional view (A), a sectional view (B), and a sectional view (C) showing a semiconductor device manufacturing method of a preferred embodiment.

As shown in FIG. 16A, conductive foil 40 is removed in an overall manner from the rear surface to electrically separate the respective conductive patterns 21. Concretely, the respective conductive patterns 21 are electrically separated by performing overall etching of the rear surface of conductive foil 40. A structure with which conductive patterns 21 are exposed from sealing resin 13, which is filled in separation grooves 24, is thus provided. In the Figure, conductive foil 40 is etched from the rear surface to the location indicated by the alternate long and short dash line to carry out the present step.

Figure 16B:
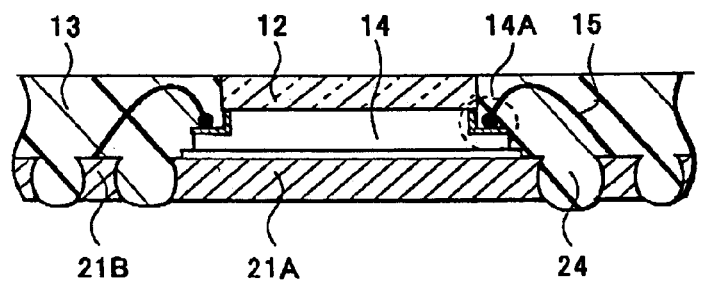

FIG. 16B shows the state in which the respective conductive patterns 21 have been electrically separated by this step.

Figure 16C:
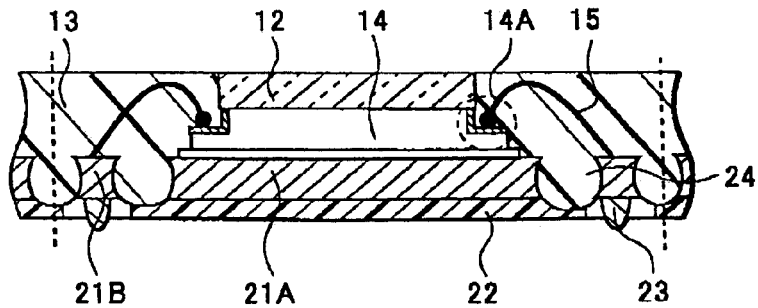

Conductive patterns 21, which are exposed at the rear surface, are covered with a cover resin 22 as shown in FIG. 16C. Openings are then provided at desired locations of cover resin 22 to form external electrodes 23. Lastly, the respective circuit devices that have been formed in matrix form are divided into individual optical semiconductor devices 10D by dicing sealing resin 23.

A merit of this process is that until being covered by sealing resin 13, conductive foil 40, which becomes conductive patterns 21, serves as the supporting substrate. With this invention, conductive foil 40, which serves as the supporting substrate, is also a material that is necessary as an electrode material. Work can be performed upon eliminating as much component material as possible and cost reduction can also be realized.

Fifth Embodiment

The configuration and a method of manufacturing a semiconductor device 10E of this embodiment shall now be described with reference to FIGS. 17 through 20. First, the configuration of optical semiconductor device 10E of this embodiment shall be described with reference to FIGS. 17 and 18.

Figure 17A:
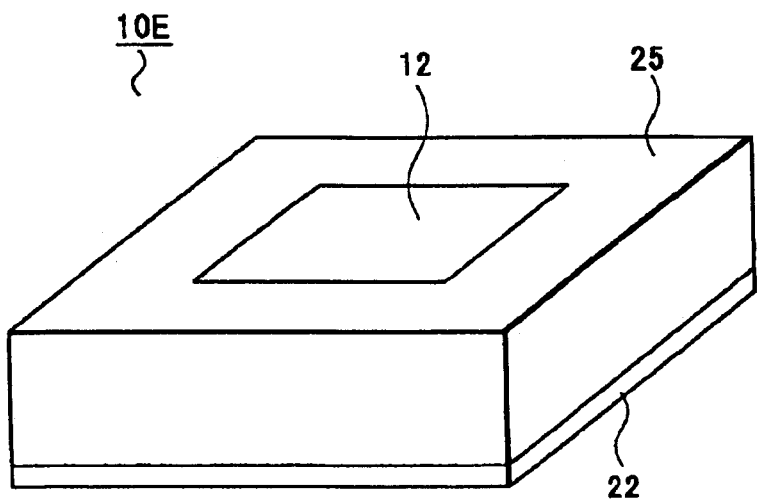
FIG. 17 is a perspective view (A), a sectional view (B), and a sectional view (C) showing a semiconductor device of a preferred embodiment.
Figure 17B:
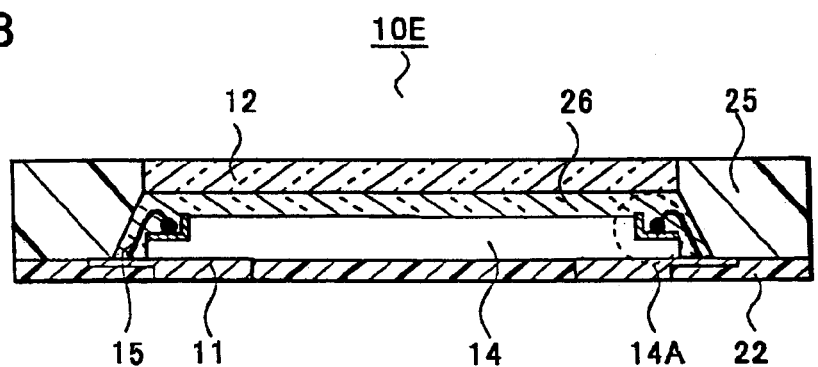
Figure 17C:
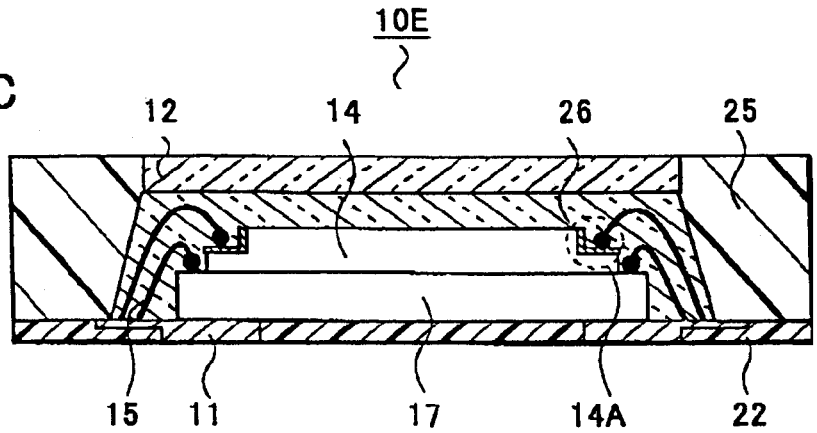

FIG. 17A is a perspective view of optical semiconductor device 10E and FIGS. 17B and 17C are sectional views thereof. As shown in these Figures, optical semiconductor device 10E comprises an optical semiconductor element 14, having a light receiving part or a light emitting part, external electrodes, disposed below the optical semiconductor element and connected to the optical semiconductor element via metal wires 15, a casing, having a cover layer 12, formed of a transparent material, provided on an upper part and containing optical semiconductor element 14 and metal wires 15 in its interior, and a transparent resin, filled in the gaps between the interior of the casing and the optical semiconductor element. The details of the respective elements shall now be described.

As shown in FIGS. 17A and 17B, casing 25 forms the outer shape of optical semiconductor device 10E and a cover layer 12, formed of a transparent material, is provided at an upper part thereof. The interior of casing 25 is hollow and the size of this hollow part is formed to be greater than the size of optical semiconductor element 14 that is to be incorporated therein. The same resin as the material of the sealing resin 13 may be used as the material of casing 25. That is, a light-blocking resin may be employed as the material of casing 25. Furthermore, ceramic, metal, etc., may also be employed as the material of casing 25.

As optical semiconductor element 14, the same element as that described for the first embodiment may be employed. Optical semiconductor element 14 and leads 11 are connected via metal wires 15. Here again, indented parts 14A are provided at peripheral parts of semiconductor element 17 and metal wires 15 are bonded to these indented parts 14A. Transparent resin 26 can thus be made thin in thickness and the thinning of optical semiconductor device 10E as a whole can be realized.

Leads 11 are formed below semiconductor element 14, the top surfaces thereof become bonding pads to which metal wires 15 are connected, and the rear surfaces thereof are partially exposed to form external electrodes. Leads 11 may be covered with cover resin 22 at locations besides locations that are to become the external electrodes.

Transparent resin 26 is filled in the hollow parts of casing 25 so as to seal optical semiconductor element 14 and metal wires 15. As transparent resin 26, a resin with a transparency equivalent to or better than cover layer 12 may be employed.

Referring to FIG. 17C, here, a semiconductor element 17 is set below optical semiconductor element 14. The same semiconductor element as that of the above-described first embodiment may be employed as semiconductor element 17.

Figure 18A:
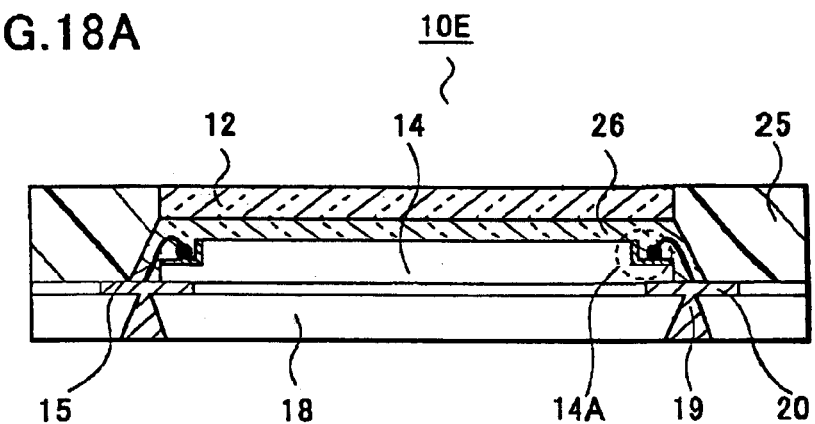
FIG. 18 is a sectional view (A) and a sectional view (B) showing a semiconductor device of a preferred embodiment.
Figure 18B:
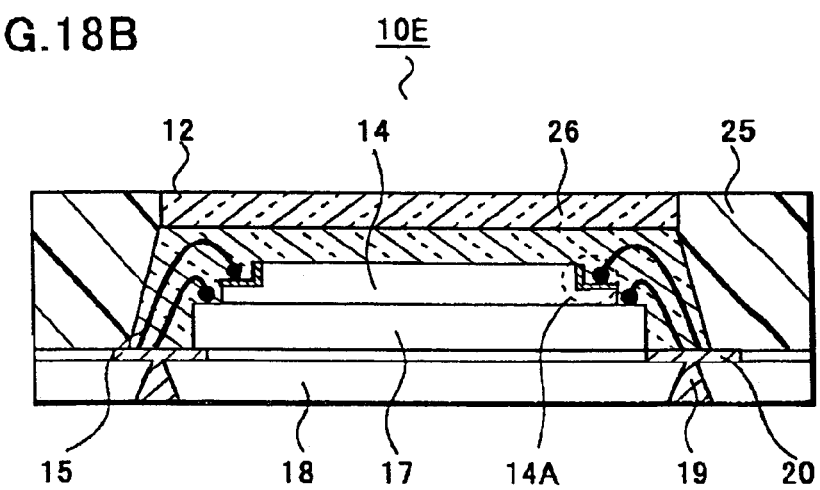

A different configuration of an optical semiconductor device 10E shall now be described with reference to FIG. 18. As shown in FIG. 18A, the basic configuration of optical semiconductor device 10E shown in this Figure is the same as that shown in FIG. 17, the difference being that a mounting substrate 18 is provided. Concretely, conductive paths 20 are formed on the top surface of mounting substrate 18 and external electrodes 19, which pass through mounting substrate 18 and are electrically connected to conductive paths 20, are provided. Here, external electrodes 19 are formed of silver, copper, or other metal. Also, in addition to optical semiconductor device 10E, semiconductor element 17 may be incorporated in optical semiconductor device 10E as shown in FIG. 18B.

A method of manufacturing optical semiconductor device 10E shall now be described with reference to FIGS. 19 and 20. The method of manufacturing optical semiconductor device 10E comprises the steps of preparing casing 25, having cover layer 12, formed of a transparent material, disposed at an upper part thereof, forming the external electrodes at the rear surface of optical semiconductor element 14 and electrically connecting optical semiconductor element 14 and the external electrodes by metal wires 15, sealing optical semiconductor element 14 and metal wires 15 with transparent resin 26 and making the outer shape of transparent resin 26 a shape that fits the interior of casing 25, and fitting transparent resin 26 into the interior of casing 25. These steps shall now be described.

Figure 19A:
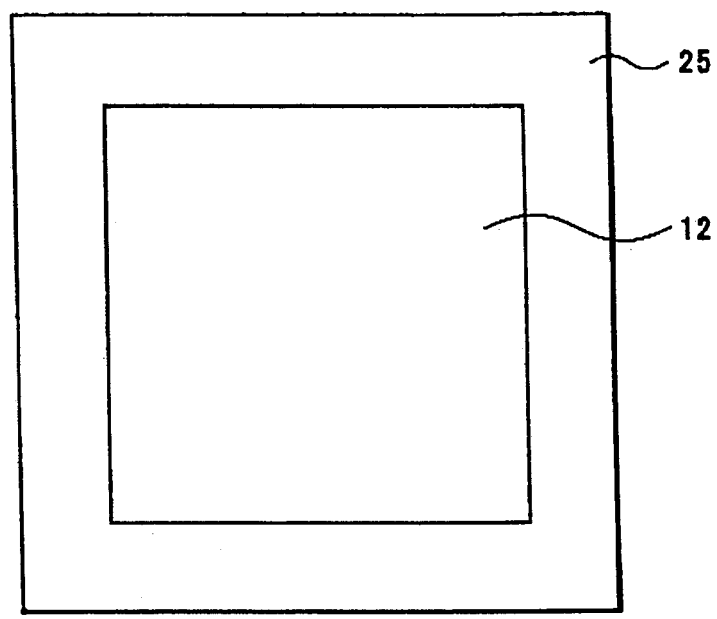
FIG. 19 is a planview (A) and a sectional view (B) showing a semiconductor device manufacturing method of a preferred embodiment.
Figure 19B:
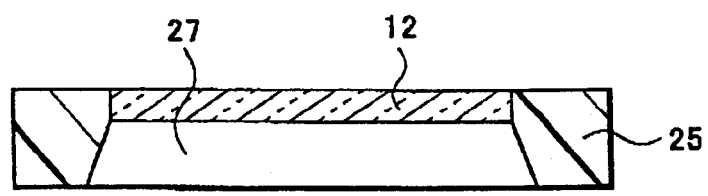

First, as shown in FIG. 19, casing 25, having cover layer 12, formed of a transparent material, disposed at an upper part thereof, is prepared. Casing 25 has the shape of a case with a hollow part 27 in its interior and has cover layer 12, through which the incorporated optical semiconductor element 14 performs the input and output of optical signals, provided at the upper part. The size of hollow part 27 is such as to provide a space that is slightly greater than optical semiconductor element 14 so that room for the incorporated optical semiconductor element 14 and its connection regions can be secured therein.

Figure 20A:
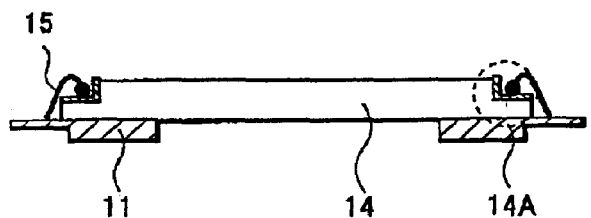
FIG. 20 is a sectional view (A), a sectional view (B), a sectional view (C), and a sectional view (D) showing a semiconductor device manufacturing method of a preferred embodiment.

Then as shown in FIG. 20A, leads 11 are disposed below optical semiconductor element 14 and the top surfaces of leads 11 are electrically connected to optical semiconductor element 14 by means of metal wires 15. Since metal wires 15 are bonded to indented parts 14A of optical semiconductor element 14, the heights of the peak parts of metal wires 15 can be made as low as possible.

Figure 20B:
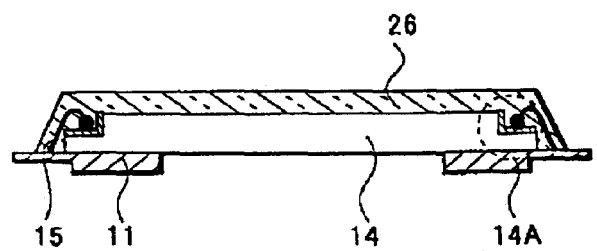

Next as shown in FIG. 20B, optical semiconductor element 14 and metal wires 15 are sealed in transparent resin 26 to make the outer shape of transparent resin 26 be a shape that fits the interior of casing 25. This step may be carried out by transfer molding using a thermosetting resin or by injection molding using a thermoplastic resin. Also as described above, by the provision of indented parts 14A, the positions of the peak parts of metal wires 15 are made as low as possible. Transparent resin 26, which covers the top surface of optical semiconductor element 14 can thus be made thin.

Figure 20C:
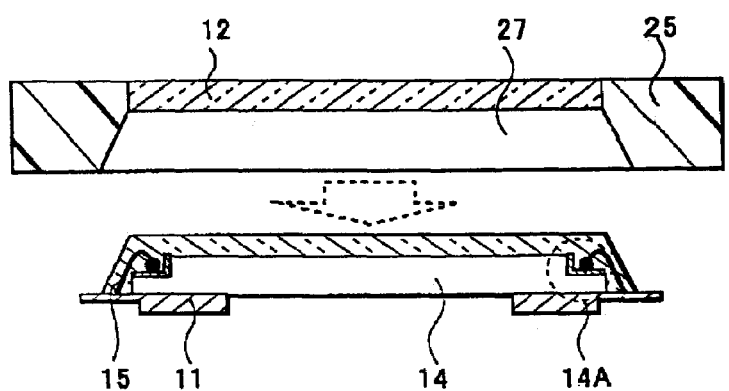

Next as shown in FIG. 20C, transparent resin 26 is fitted into the interior of casing 25 using an adhesive agent. Optical semiconductor element 14 is thereby housed in the interior of casing 25. As the adhesive agent to be used for fitting transparent resin 26 inside casing 25, a transparent adhesive agent is used.

Figure 20D:
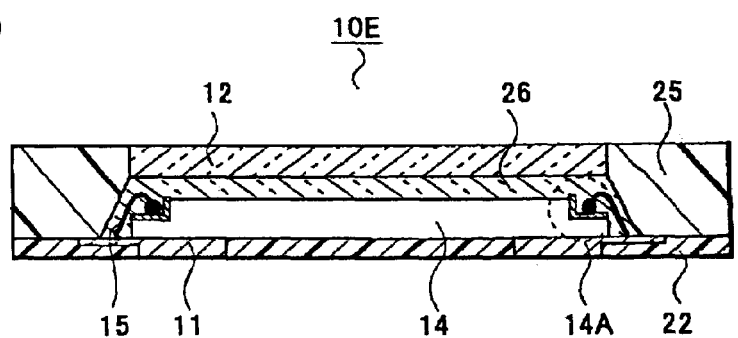

Lastly, the rear surface of optical semiconductor device 10E is covered with cover resin 22 as shown in FIG. 20D. By using a light-blocking resin as cover resin 22, the entry of noise into the interior of optical semiconductor device 10E from the rear surface can be prevented.

Sixth Embodiment

The configuration and a method of manufacturing optical semiconductor element 14, which is incorporated in optical semiconductor device 10 of each of the embodiments described above, shall now be described with reference to FIGS. 21 through 25. First, the configuration and method of manufacturing semiconductor device 10E of this embodiment shall be described.

Figure 21A:
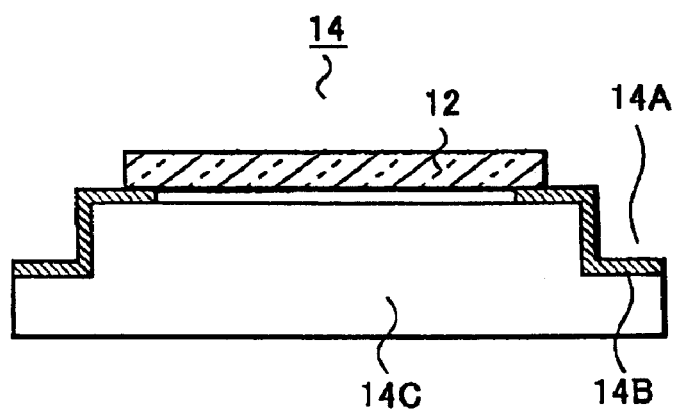
FIG. 21 is a sectional view (A), a sectional view (B), and a sectional view (C) showing an optical semiconductor element incorporated in a semiconductor device of a preferred embodiment.

First, the configuration of optical semiconductor element 14 shall be described with reference to FIG. 21A. Optical semiconductor element 14 has a light receiving element or a light emitting element on its top surface and is provided at its peripheral parts with indented parts 14A, which are uniformly indented. Also, a cover layer 12 is disposed on the top surface of the element.

The light receiving element to be formed on the top surface of optical semiconductor element 14 may be a solid-state image pickup element, such as a CCD (Charge Coupled Device) image sensor or a CMOS (Complementary Metal Oxide Semiconductor) image sensor, etc., or a photosensor, such as a photodiode, phototransistor, etc., maybe employed as optical semiconductor element 14. As a light emitting element, a light emitting diode or a semiconductor laser maybe employed as optical semiconductor element 14. Furthermore, a MEMS (Micro Electro Mechanical System) may be used in place of optical semiconductor element 14.

As the material of cover layer 12, a material, which is transparent to the light that is input into optical semiconductor element 14 or the light that is output from optical semiconductor element 14, is used. For example, if optical semiconductor element 14 is an element that detects visible rays, a material that is transparent to visible rays is employed as cover layer 12. Concretely, glass or an acrylic plate, etc., may be used as cover layer 12. Furthermore, in the case where optical semiconductor element 14 is an image pickup element, such as a CCD image sensor, etc., a filter, etc., are added.

Indented part 14A is a region at which a peripheral part of optical semiconductor element 14 is indented uniformly and has a metal wiring 14B, comprising a plating film, etc., formed thereon. A bonding pad, comprising metal wiring 14B, is formed on the top surface of indented part 14A, and a metal wire is connected to this bonding pad. By providing indented parts 14A, the heights of the peak parts of metal wires 15 that are bonded thereto can be made low with respect to optical semiconductor element 14. Also here, the side surface of each indented part 14A is made perpendicular to the planar direction of optical semiconductor element 14. Metal wirings 14B has the function of rewiring the circuit formed on the top surface of semiconductor substrate 14C to indented parts 14A disposed at the peripheral parts.

Figure 21B:
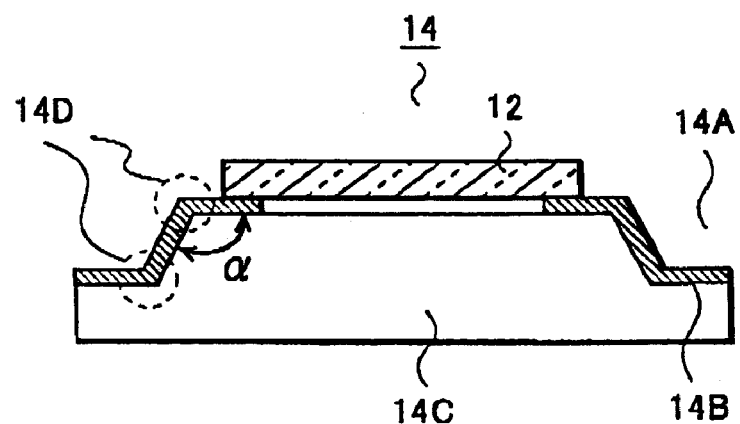

Referring to FIG. 21B, with optical semiconductor element 14 shown in this Figure, indented parts 14A have a shape with which their side surfaces are inclined. The angle α of corner parts 14D is thus an obtuse angle, and the occurrence of disconnection, etc., at these corner parts 14D in a step of patterning metal wirings 14B by a plating method, etc., can be prevented.

Figure 21C:
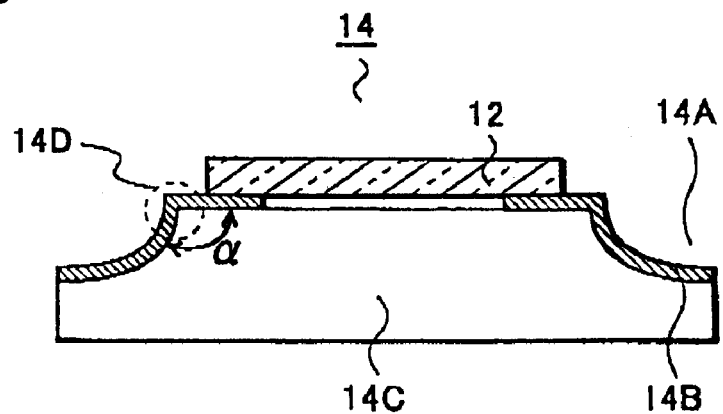

With optical semiconductor element 14 shown in FIG. 21C, each indented part 14A has a curved cross-sectional shape. The occurrence of disconnection, etc., at corner parts 14D in a step of patterning metal wirings 14B by a plating method, etc., can thus be prevented.

A method of manufacturing optical semiconductor element 14 shall now be described with reference to FIGS. 22 to 25.

First as shown in FIG. 22, indented parts 14A are formed by performing half scribing using a dicing saw 46. FIG. 22A is a perspective view illustrating this step in outline and FIGS. 22B, 22C, and 22D are sectional views showing states of performing half scribing using dicing saws 46 of different blade edge shapes.

Figure 22A:
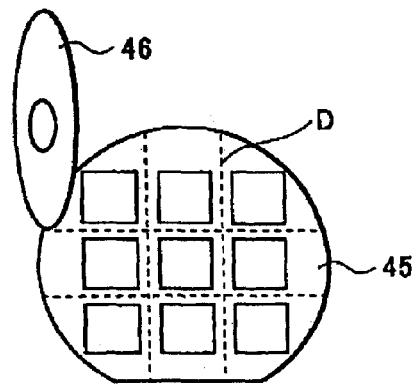
FIG. 22 is a perspective view (A), a sectional view (B) a sectional view (C), and a sectional view (D) showing a method for manufacturing the optical semiconductor element incorporated in a semiconductor device of a preferred embodiment.

Referring to FIG. 22A, a wafer 45 that is subject to this step has individual circuits, each containing a light receiving element or a light emitting element, formed in matrix form and half scribing is performed along dicing lines D that correspond to the boundaries of the respective circuits.

Figure 22B:
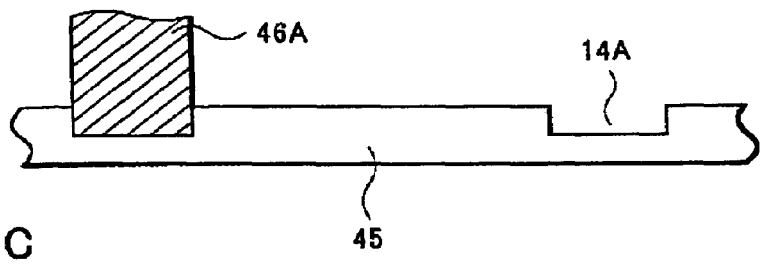

Referring to FIG. 22B, here half scribing is performed using a dicing saw 46A with a flat blade edge. The cross-sectional shape of an indented part 14A will thus have a right-angled side surface as shown at the right side of the Figure.

Figure 22C:
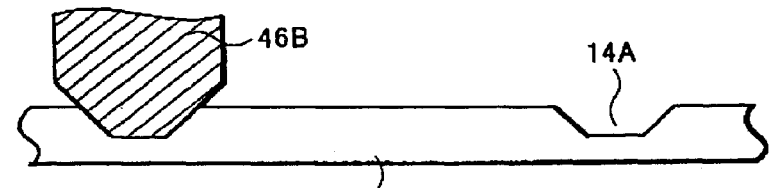

Referring to FIG. 22C, here half scribing is performed using a dicing saw 46A having inclined parts at both sides of the blade edge. Thus with the cross-sectional shape of an indented part 14A, the side surface is formed in an inclined manner as shown at the right side of the Figure.

Figure 22D:
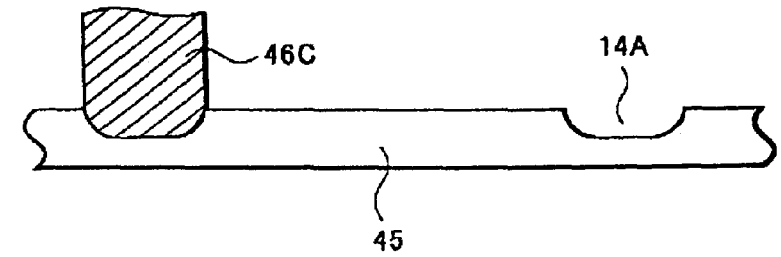

Referring to FIG. 22D, here half scribing is performed using a dicing saw 46A having curved shapes at both sides of the blade edge. The cross-sectional shape of an indented part 14A will thus be curved as shown at the right side of the Figure.

Figure 23:
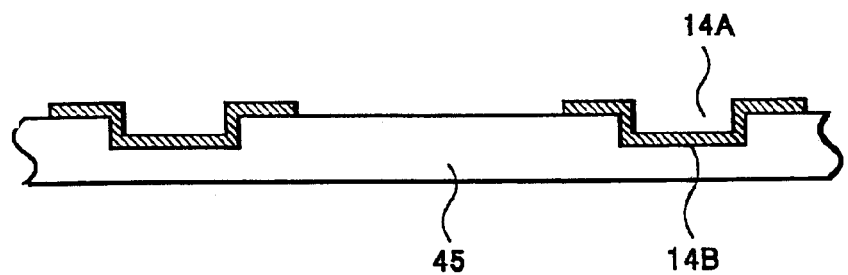
FIG. 23 is a sectional view showing the method for manufacturing the optical semiconductor element incorporated in a semiconductor device of a preferred embodiment.

Metal wirings 14B, electrically connected to the circuits formed on the top surface of wafer 45, are then disposed in indented parts 14A as shown in FIG. 23. Ag, Au, Pt, or Pd, etc., is used as the material of metal wiring 14B and coating is performed by vapor deposition, sputtering, CVD or other form of low vacuum or high vacuum deposition method or by electrolytic plating, electroless plating, or sintering, etc.

Figure 24:
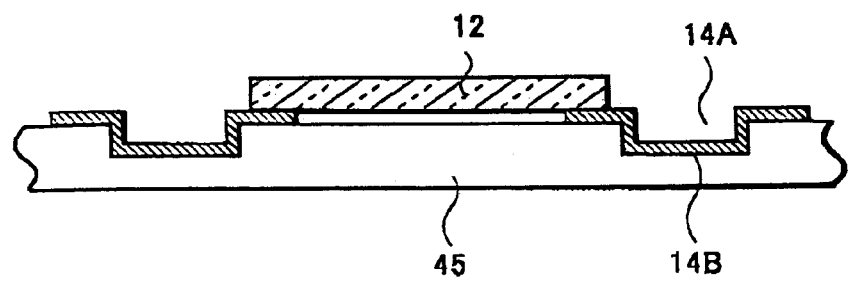
FIG. 24 is a sectional view for describing the method showing the optical semiconductor element incorporated in a semiconductor device of a preferred embodiment.

Next as shown in FIG. 24, cover layers 12 are adhered onto the upper parts of the respective circuits to protect the respective circuits formed on the top surface of wafer 45. The locations of cover layers 12 corresponding to metal wirings 14B are processed so as not to interfere with metal wirings 14B. Cover layers 12 are adhered using an adhesive agent, such as epoxy resin.

Figure 25:
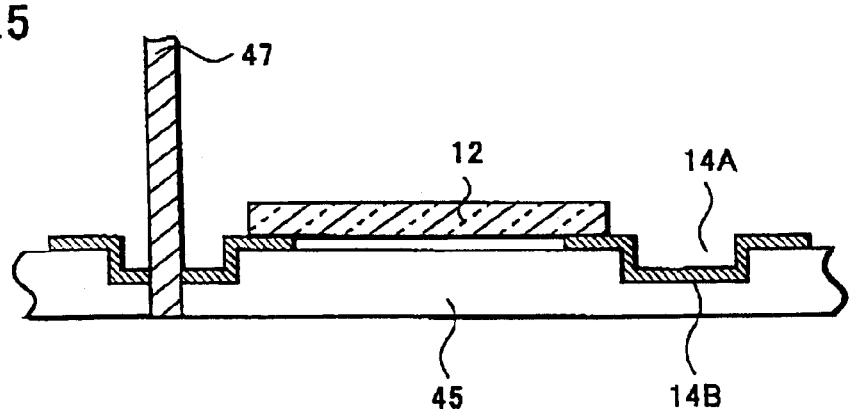
FIG. 25 is a sectional view showing the method for manufacturing the optical semiconductor element incorporated in a semiconductor device of a preferred embodiment.

Full scribing using a dicing saw 47 is then performed to separate the respective optical semiconductor elements 14 as shown in FIG. 25. Here, the remaining thickness parts of wafer 45 and metal wirings 14B at central parts of indented parts 14A are cut by dicing saw 47. Here, as dicing saw 47, a saw that is narrower in width than the dicing saw 46 is used. Optical semiconductor element 14 of this embodiment is manufactured by the above steps.

Seventh Embodiment

The configuration and a method of manufacturing an optical semiconductor device 10F of this embodiment shall now be described with reference to FIGS. 26 and 27. Optical semiconductor device 10F comprises an optical semiconductor element 14, having a light receiving part or a light emitting part, a cover layer 12, covering the top surface of optical semiconductor element 14, a semiconductor element 17, electrically connected to optical semiconductor element 14, external electrodes, electrically connected to semiconductor element 17 for performing input and output of electrical signals with the exterior, and a sealing resin 13, sealing optical semiconductor element 14 and semiconductor element 17, and has a configuration with which cover layer 12 is exposed from sealing resin 13. As the external electrodes, for example, leads, etc., having one of the ends thereof exposed from sealing resin 17, may be employed.

As mentioned above, the basic configuration of optical semiconductor device 10F of this embodiment is the same as that of the first embodiment, the difference being that semiconductor element 17, which is electrically connected to optical semiconductor element 14, is provided. Furthermore, the electrical connection between the two is made via electrodes 14E.

Figure 26A:
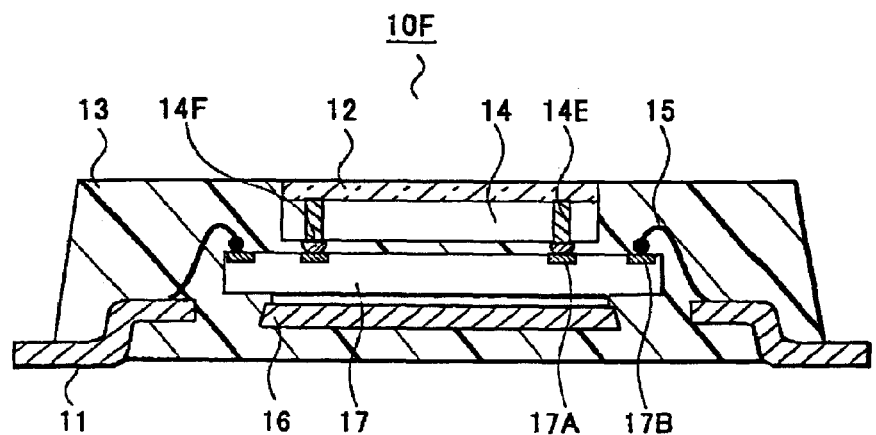
FIG. 26 is a sectional view (A) and a sectional view (B) showing a semiconductor device of a preferred embodiment.

As shown in FIG. 26A, optical semiconductor element 14 has through electrodes 14E passing through from the top surface to the rear surface thereof and is connected to semiconductor element 17 via through electrodes 14E.

Through electrodes 14E are electrically connected to an electrical circuit formed on the top surface of optical semiconductor element 14 and are formed by the embedding of copper or other metal in through holes. Here, an electrical circuit, which includes a light receiving element or a light emitting element, is arranged near a central part of the top surface of optical semiconductor element 14 and through electrodes 14, which are connected to this electrical circuit, are formed at peripheral parts thereof. Through electrodes 14E that are exposed at the rear surface of optical semiconductor element 14 have bump electrodes 14F formed thereon.

Semiconductor element 17 has optical semiconductor element 14 affixed to it supper part. First pads 17A are provided at locations corresponding to through electrodes 14E of optical semiconductor element 14. First pads 17A are connected to an electrical circuit formed on the top surface of semiconductor element 17. Also, second pads 17B for connection with the exterior are disposed at peripheral parts of the top surface of semiconductor element 17. Here, leads 11, which form external electrodes, and second pads 17B are electrically connected via metal wires 15. As was described with the first embodiment, a circuit for the processing of signals obtained by optical semiconductor element 14, etc., may be employed as the electrical circuit arranged in semiconductor element 17. Also, semiconductor element 17 is affixed onto a land 16.

Figure 26B:
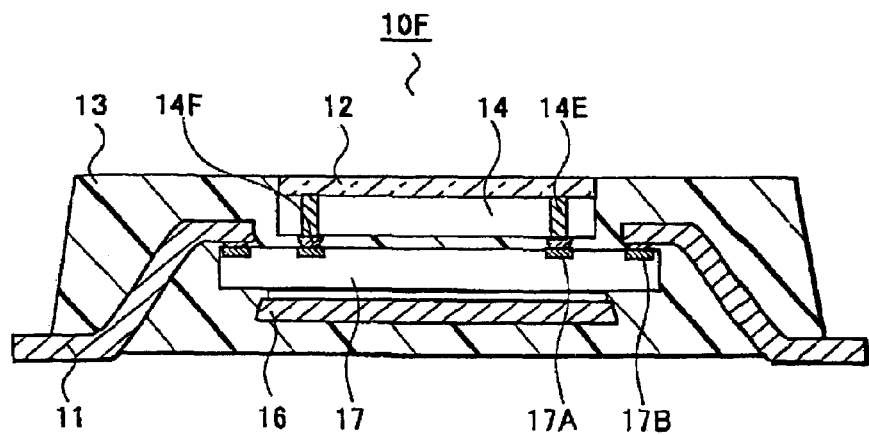

Referring to FIG. 26B, here leads 11 and semiconductor element 17 are connected directly. One end of each lead 11 is exposed from the rear surface of sealing resin 13 and forms an external electrode. The other end of each lead 11 is directly connected by soft solder or other solder material to a second pad 17B disposed at a peripheral part of semiconductor element 17. Semiconductor element 17 is affixed to leads 11 by such a connection structure of leads 11. The entire device can thus be arranged upon eliminating land 16.

Figure 27:
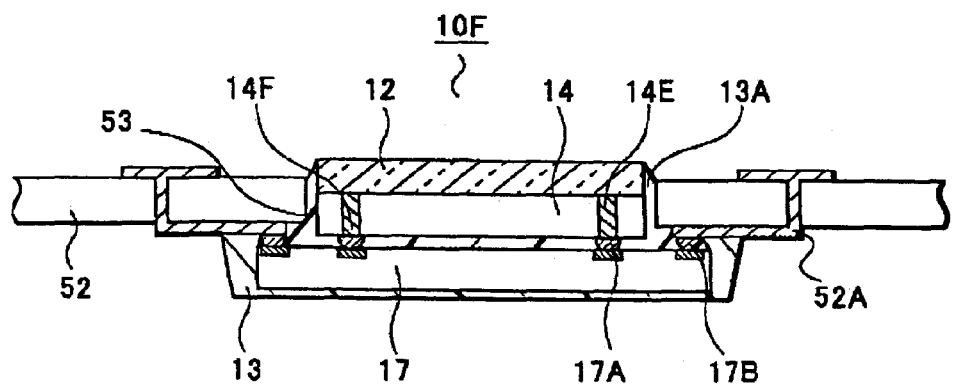
FIG. 27 is a sectional view showing a semiconductor device of a preferred embodiment.

Referring to FIG. 27, here, second pads 17B, disposed at peripheral parts of semiconductor element 17, are connected to a substrate 52. Concretely, an opening 53 of a size greater than a size enabling the containing of optical semiconductor element 14 is provided in substrate 52. Pads of conductive paths 52A are provided at peripheral parts of opening 53 corresponding to the positions of second pads 17B. Second pads 17B of semiconductor element 17 are connected to conductive paths 52A by soft solder or other solder material. The connection structure of semiconductor element 17 and optical semiconductor element 14 is the same as that shown in FIG. 26. Also, conductive paths 52A may be made to pass through substrate 52 and extend to the opposite surface thereof.

Filling resin 13A is filled in the gaps between optical semiconductor element 14 and opening 53 and the gaps between semiconductor element 17 and optical semiconductor element 14. Filling resin 13A may furthermore be formed so as to protect side surface parts of cover layer 12. Sealing resin 13 is also formed so as to cover semiconductor element 17.

Figure 28:
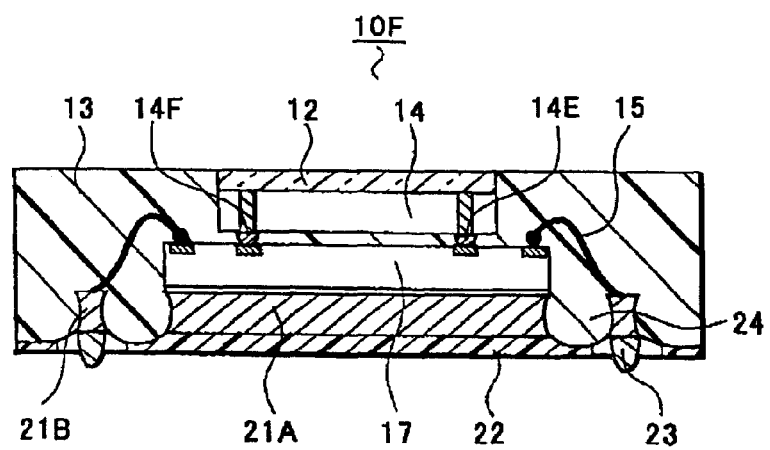
FIG. 28 is a sectional view showing a semiconductor device of a preferred embodiment.
Figure 29A:
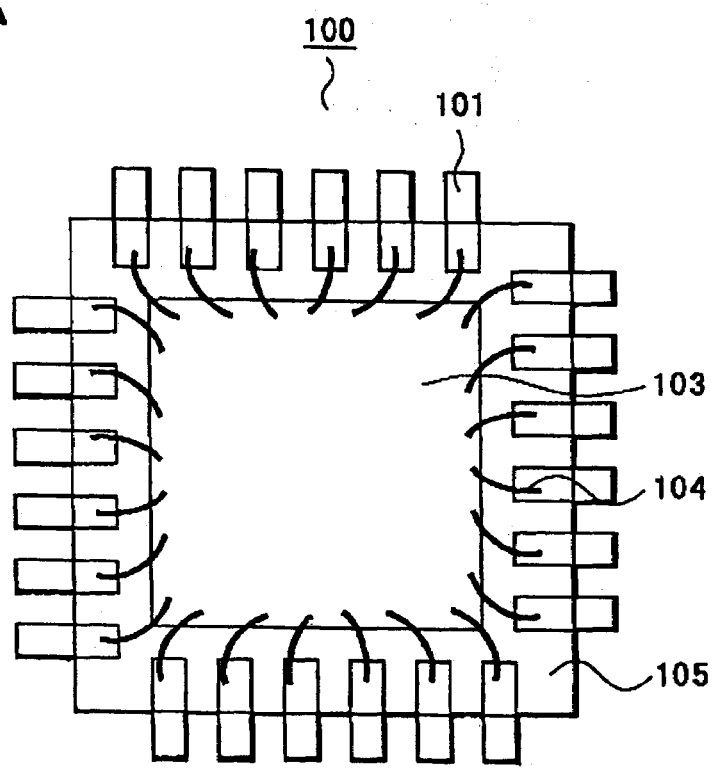
FIG. 29 is a plan view (A) and a sectional view (B) showing a conventional semiconductor device.
Figure 29B:
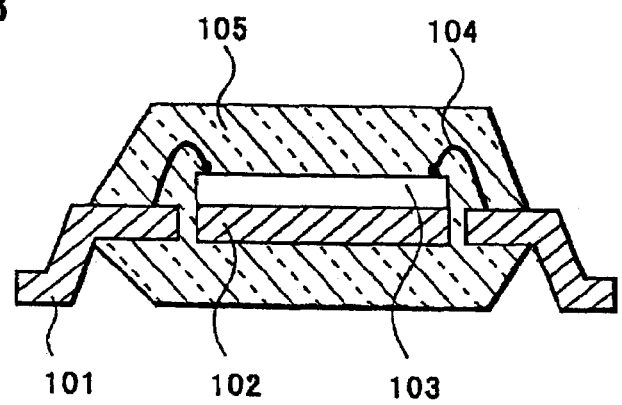

A different configuration of optical semiconductor device 10F shall now be described with reference to FIG. 28. The basic configuration of optical semiconductor device 10F shown in this Figure is the same as that shown in FIG. 26, the main difference being that conductive patterns 21 are provided in place of leads 11. The configuration of optical semiconductor device 10F shall now be described in detail, mainly in regard to this difference.

A semiconductor element 17, having an optical semiconductor element 14 set on the upper part thereof, is affixed onto a first conductive pattern 21A that has the form of a land. Second conductive patterns 21B are formed so as to surround first conductive pattern 21A and first conductive pattern 21A and second conductive patterns 21B are connected by metal wires 15. The respective conductive patterns 21 are electrically separated by means of separation grooves 24 that are filled with a sealing resin 31.

Optical semiconductor element 14, semiconductor element 17, conductive patterns 21, and metal wires 15 are sealed by sealing resin 13. The rear surfaces of conductive patterns 21 are exposed from sealing resin 13. The rear surface of optical semiconductor device 1OF at positions other than locations at which external electrodes 23 are formed are covered with a cover resin 22. Furthermore, cover layer 12 is exposed from sealing resin 13 at the surface at the side opposite the surface at which external electrodes 23 are formed.

With the above-described optical semiconductor device 10F, since optical semiconductor element 14 and semiconductor element 17 are electrically connected by through electrodes 14E provided in optical semiconductor element 14, operation at higher speed can be realized in comparison to a case where the two are connected by metal wires.

Though an optical semiconductor device and manufacturing method thereof were described above in the preferred embodiments, various modifications are possible within a scope that does not fall outside the gist of this invention. Concretely, though optical semiconductor element 14 and leads 11 are connected via metal wires 15 as shown in FIG. 2, etc., the two may be connected instead by bumps or other connection means. That is, the connection between optical semiconductor element 14 and leads 11 maybe made using ILB (Inner LeadBonding) or TAB (Tape Automated Bonding).

What is claimed is:

1. A semiconductor device manufacturing method, comprising:
    protecting a top surface of a cover layer with a sheet, wherein the cover layer is a part of the semiconductor device and wherein the cover layer covers a top surface of an optical semiconductor element having a light receiving part or a light emitting part; and
    sealing, thereafter, the optical semiconductor element with a sealing resin,
    wherein sealing the optical semiconductor element is performed using molding dies with one surface of the sheet contacting the cover layer and the other surface of the sheet contacting inner walls of the molding dies.

2. The method of claim 1, wherein the molding dies comprise an upper die and a lower die and the sealing is performed upon adhering the sheet to substantially the entire inner walls of either the upper die or the lower die.

3. The method of claim 1, in which protecting the top surface of the cover layer comprises protecting the top surface of a transparent cover layer.

4. The method of claim 1, in which protecting the top surface of the cover layer comprises protecting the top surface of a glass cover layer.

5. The method of claim 1, in which protecting the top surface of the cover layer with a sheet comprises protecting the top surface of the cover layer with a sheet equal in size to the cover layer.

6. The method of claim 1, wherein sealing the optical semiconductor element comprises exposing a surface of the cover layer from the sealing resin.

7. The method of claim 1, in which sealing the optical semiconductor element with resin comprises sealing the optical semiconductor element with an opaque resin.

8. A semiconductor device manufacturing method comprising:
    providing lands and leads on a substrate, wherein the substrate includes a conductive member;
    adhering a bottom surface of the substrate onto a first sheet;
    covering a top surface of an optical semiconductor element with a cover layer, wherein the cover layer is a part of the semiconductor device;
    affixing the optical semiconductor element onto the lands of the substrate;
    protecting an upper surface of the cover layer with a second sheet; and
    sealing the lands, the leads, and the optical semiconductor elements on the substrate with a sealing resin,
    wherein, during sealing, one surface of the second sheet contacts the cover layer and the other surface of the second sheet contacts inner walls of molding dies.

9. The method of claim 8, wherein the molding dies comprise an upper die and a lower die and sealing is performed upon adhering the second sheet to substantially the entire inner walls of either the upper die or the lower die.

10. The method of claim 8, in which covering a top surface of an optical semiconductor element comprises covering the top surface of the optical semiconductor element with a transparent cover layer.

11. The method of claim 8, in which covering a top surface of an optical semiconductor element comprises covering the top surface of the optical semiconductor element with a glass cover layer.

12. The method of claim 8 in which protecting an upper surface of the cover layer with a second sheet comprises protecting the upper surface of the cover layer with a second sheet equal in size to the cover layer.

13. The method of claim 8 wherein sealing the lands, the leads, and the optical semiconductor elements comprises exposing a surface of the cover layer from the sealing resin.

14. The method of claim 8 in which sealing the lands, the leads, and the optical semiconductor elements on the substrate with a sealing resin comprises sealing with an opaque resin.

* * * * *